(12) United States Patent
Yamamoto et al.

(10) Patent No.: US 9,130,039 B2
(45) Date of Patent: Sep. 8, 2015

(54) SEMICONDUCTOR DEVICE AND MANUFACTURING METHOD OF THE SAME

(71) Applicant: Renesas Electronics Corporation, Kawasaki-shi, Kanagawa (JP)

(72) Inventors: Yoshiki Yamamoto, Kanagawa (JP); Hideki Makiyama, Kanagawa (JP); Toshiaki Iwamatsu, Kanagawa (JP); Takaaki Tsunomura, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/962,066

(22) Filed: Aug. 8, 2013

(65) Prior Publication Data

US 2014/0042529 A1    Feb. 13, 2014

(30) Foreign Application Priority Data

Aug. 10, 2012  (JP) .................. 2012-178715

(51) Int. Cl.
| H01L 29/76 | (2006.01) |
| H01L 29/78 | (2006.01) |
| H01L 29/66 | (2006.01) |
| H01L 29/417 | (2006.01) |
| H01L 29/786 | (2006.01) |

(52) U.S. Cl.
CPC ...... *H01L 29/7827* (2013.01); *H01L 29/41783* (2013.01); *H01L 29/6653* (2013.01); *H01L 29/6656* (2013.01); *H01L 29/66628* (2013.01); *H01L 29/66666* (2013.01); *H01L 29/66772* (2013.01); *H01L 29/78621* (2013.01); *H01L 29/665* (2013.01)

(58) Field of Classification Search
CPC ............... H01L 29/7827; H01L 29/66666; H01L 29/6653; H01L 29/78621; H01L 29/41783; H01L 29/665; H01L 29/6628; H01L 29/78
USPC ......... 257/288, 330, 341, 350, 401, E27.099, 257/E27.066, E29.066, E29.13, E29.263, 257/E21.435, 300, 347, E27.112, E21.32, 257/E21.54, E21.561, E21.5, 64
See application file for complete search history.

(56) References Cited

U.S. PATENT DOCUMENTS

| 6,025,629 | A | * | 2/2000 | Ipposhi et al. | ................ | 257/347 |
| 6,365,465 | B1 | * | 4/2002 | Chan et al. | .................... | 438/283 |
| 6,900,143 | B1 | * | 5/2005 | Pan et al. | ...................... | 438/752 |
| 7,537,981 | B2 | * | 5/2009 | Kohyama | ..................... | 438/151 |
| 7,750,338 | B2 | * | 7/2010 | Wang | ............................. | 257/19 |
| 8,975,699 | B2 | * | 3/2015 | Iwamatsu et al. | ............. | 257/347 |
| 2002/0027246 | A1 | * | 3/2002 | Kunikiyo | ...................... | 257/347 |
| 2004/0227185 | A1 | * | 11/2004 | Matsumoto et al. | ......... | 257/347 |
| 2005/0110082 | A1 | * | 5/2005 | Cheng et al. | .................. | 257/341 |
| 2005/0285193 | A1 | * | 12/2005 | Lee et al. | ...................... | 257/347 |

(Continued)

FOREIGN PATENT DOCUMENTS

JP    2000-223713 A    8/2000

*Primary Examiner* — Yosef Gebreyesus
(74) *Attorney, Agent, or Firm* — Miles & Stockbridge P.C.

(57) ABSTRACT

A semiconductor device is manufactured by using an SOI substrate having an insulating layer on a substrate and a semiconductor layer on the insulating layer. The semiconductor device is provided with a gate electrode formed on the semiconductor layer via a gate insulating film, a sidewall spacer formed on a sidewall of the gate electrode, a semiconductor layer for source/drain that is epitaxially grown on the semiconductor layer, and a sidewall spacer formed on a sidewall of the semiconductor layer.

2 Claims, 30 Drawing Sheets

(56) References Cited

U.S. PATENT DOCUMENTS

| | | | |
|---|---|---|---|
| 2008/0054352 A1* | 3/2008 | Imoto et al. | 257/330 |
| 2008/0237680 A1* | 10/2008 | Pangal et al. | 257/315 |
| 2009/0170270 A1* | 7/2009 | Chakravarthi et al. | 438/300 |
| 2009/0224321 A1* | 9/2009 | Tsuchiya | 257/351 |
| 2009/0267149 A1* | 10/2009 | Hua et al. | 257/347 |
| 2012/0012946 A1* | 1/2012 | Yugami | 257/411 |
| 2012/0282743 A1* | 11/2012 | Saitoh et al. | 438/152 |
| 2013/0115759 A1* | 5/2013 | Park et al. | 438/478 |
| 2013/0273706 A1* | 10/2013 | Hung et al. | 438/303 |

* cited by examiner

SEMICONDUCTOR DEVICE AND MANUFACTURING METHOD OF THE SAME

CROSS-REFERENCE TO RELATED APPLICATION

The present application claims priority from Japanese Patent Application No. 2012-178715 filed on Aug. 10, 2012, the content of which is hereby incorporated by reference into this application.

TECHNICAL FIELD OF THE INVENTION

The present invention relates to a semiconductor device and a manufacturing method of the same, and is suitably applied to, for example, a semiconductor device provided with a MISFET and a manufacturing method of the same.

BACKGROUND OF THE INVENTION

A MISFET is formed by forming a gate electrode on a substrate via a gate insulating film and forming source/drain regions in the substrate.

Also, there is a technique in which a MISFET is formed by growing an epitaxial semiconductor layer for source/drain on a substrate.

Japanese Patent Application Laid-Open Publication No. 2000-223713 (Patent Document 1) discloses a technique relating to a semiconductor device in which an epitaxial layer is grown on source and drain of an SOI substrate

SUMMARY OF THE INVENTION

Also for the semiconductor device in which an epitaxial semiconductor layer for source/drain of a MISFET is grown on a substrate, it is desired to improve the performance as much as possible. Alternatively, it is desired to improve the reliability of the semiconductor device. Moreover, it is desired to improve both of the performance and the reliability.

These and other problems and novel features of the present invention will be apparent from the following descriptions of the present specification and the accompanying drawings.

According to one embodiment, a semiconductor device using a substrate provided, with a support substrate, an insulating layer on the support substrate and a first semiconductor layer on the insulating layer includes: a first sidewall insulating film formed on a sidewall of a gate electrode that is formed on the first semiconductor layer via a gate insulating film; and a second sidewall insulating film formed on a sidewall of an epitaxial semiconductor layer for source/drain that is formed on the first semiconductor layer.

Moreover, according to one embodiment, in a manufacturing method of a semiconductor device using a substrate provided with a support substrate, an insulating layer on the support substrate and a first semiconductor layer on the insulating layer, after forming a first sidewall insulating film on a sidewall of a gate electrode formed on the first semiconductor layer via a gate insulating film, an epitaxial semiconductor layer is grown on the first semiconductor layer. Then, after removing at least one portion of the first sidewall insulating film, a second sidewall insulating film is formed on a sidewall of the gate electrode and a third sidewall insulating film is formed on a sidewall of the epitaxial semiconductor layer, respectively.

According to the embodiment, it is possible to improve the performance of the semiconductor device. Alternatively, it is possible to improve the reliability of the semiconductor device. Moreover, it is possible to improve both of the performance and the reliability.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, the embodiment will be described in detail with reference to drawings. Note that components having the same function are denoted by the same reference symbols throughout the drawings for describing the embodiment, and the repetitive description thereof is omitted. In addition, the description of the same or similar portions is not repeated in principle unless particularly required in the following embodiments.

Also, in some drawings used in the following embodiments, hatching is omitted even in a cross-sectional view so as to make the drawings easy to see. In addition, hatching is used even in a plan view so as to make the drawings easy to see.

(First Embodiment)
<Structure of Semiconductor Device>

Figure 1:
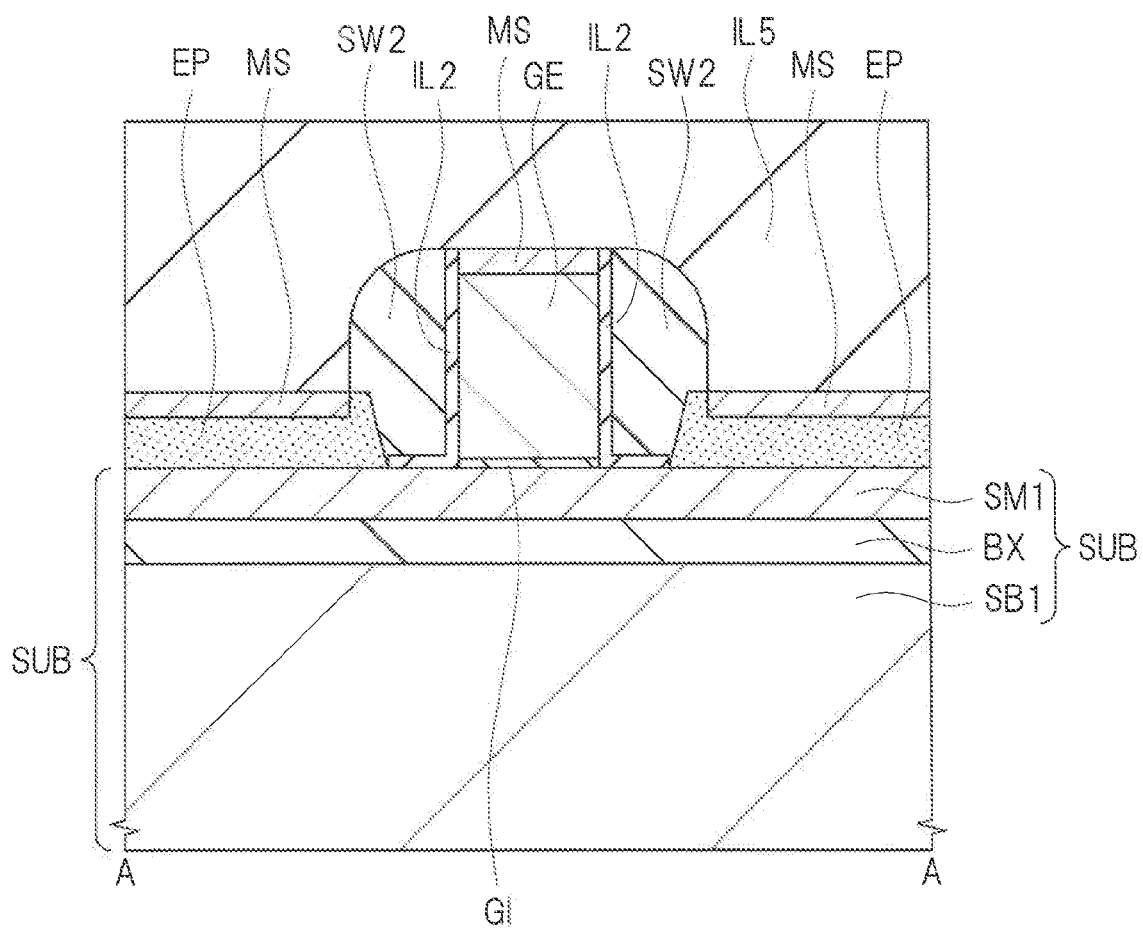
FIG. 1 is a cross-sectional view showing the principal part of a semiconductor device according to an embodiment.
Figure 2:
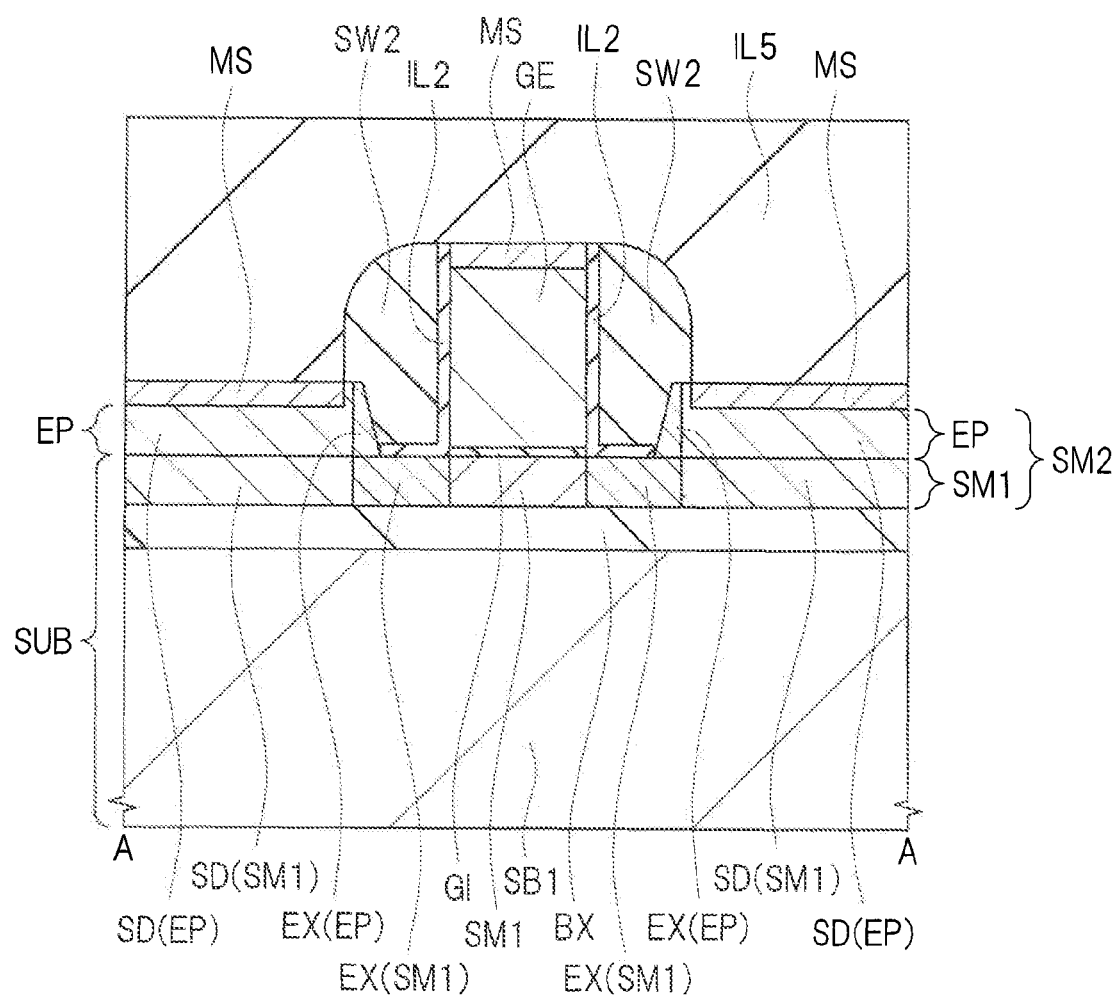
FIG. 2 is a cross-sectional view showing the principal part of the semiconductor device according to the embodiment.
Figure 3:
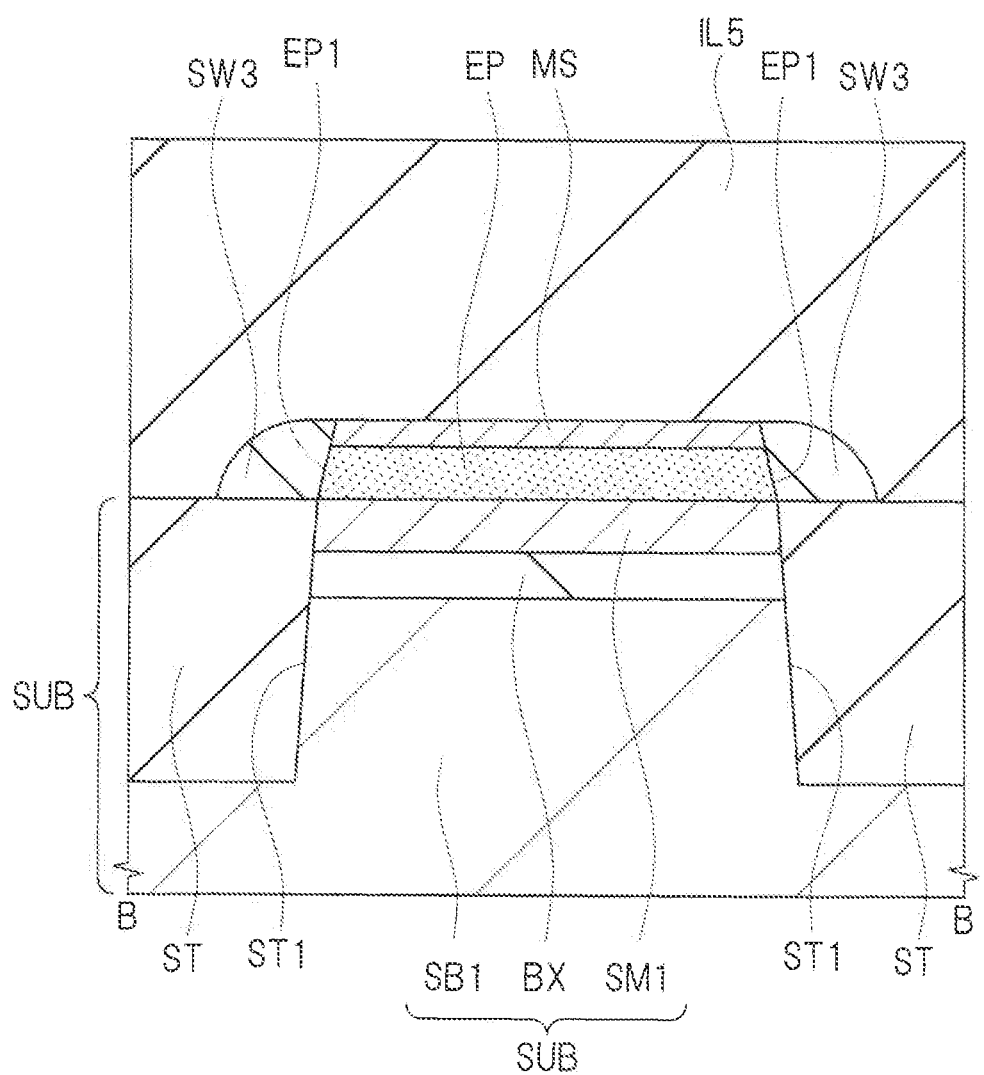
FIG. 3 is a cross-sectional view snowing the principal part of the semiconductor device according to the embodiment.
Figure 4:
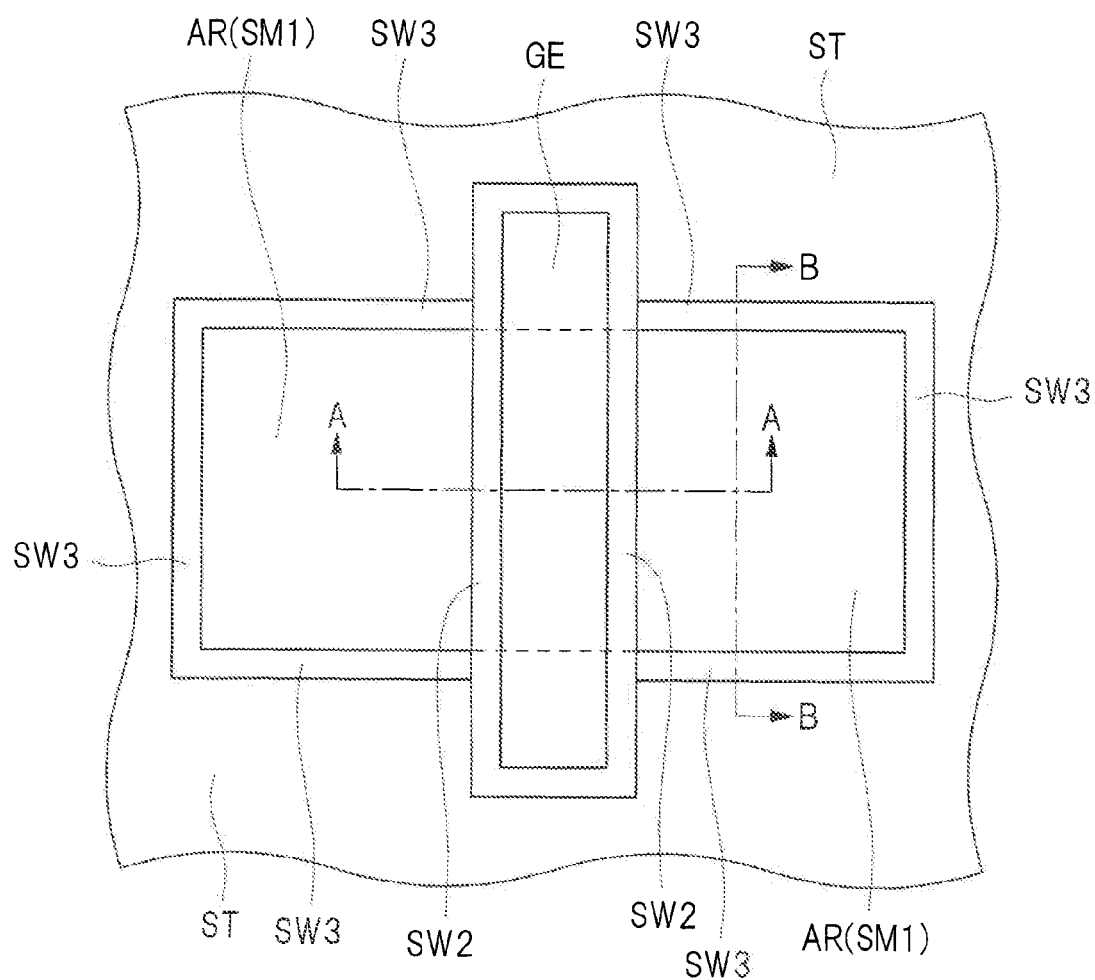
FIG. 4 is a plan view showing the principal part of the semiconductor device according to the embodiment.

FIG. 1 to FIG. 3 are cross-sectional views showing the principal part of a semiconductor device according to the present embodiment, and FIG. 4 is a plan view showing the principal part of the semiconductor device of the present embodiment. FIG. 1 and FIG. 2 show the cross-sectional views of the same region, and both correspond to the cross-sectional view taken along the line A-A of FIG. 4. FIG. 3 shows the cross-sectional view of the region different from that of FIG. 1 and FIG. 2, and it corresponds to the cross-sectional view taken along the line B-B of FIG. 4.

In this case, in FIG. 1, in order that the regions to which a semiconductor layer SM1 and a semiconductor layer EP respectively correspond are easily recognized, the entire semiconductor layer EP is hatched with dots and the entire semiconductor layer SM1 is hatched with diagonal lines, and formation regions of an $n^-$-type semiconductor region EX and an $n^+$-type semiconductor region SD are not illustrated. Moreover, in FIG. 2, in order that regions to which the $n^-$-type semiconductor region EX and the $n^+$-type semiconductor region SD respectively correspond are easily recognized, the entire $n^-$-type semiconductor region EX is hatched with the same pattern, and the entire n⁺-type semiconductor region SD is hatched with the other pattern. Therefore, by viewing FIG. 1 and FIG. 2 in combination, it is possible to easily understand the configuration of the semiconductor layer SM1 and the semiconductor layer EP and the formation regions of the n⁻-type semiconductor region EX and the n⁺-type semiconductor region SD in the semiconductor layer SM1 and the semiconductor layer EP. Moreover, FIG. 4 shows the planar layout of an element isolation region ST, an active region AR defined by the element isolation region ST, a gate electrode GE and sidewall spacers SW2 and SW3, and illustrations of the other members are omitted. The active region AR corresponds to the semiconductor layer SM1 that is defined by (surrounded in a plan view by) the element isolation region ST.

As shown in FIGS. 1 to 4, the semiconductor device of the present embodiment is a semiconductor device provided with a MISFET (Metal Insulator Semiconductor Field Effect Transistor).

Also, as shown in FIGS. 1 to 4, the semiconductor device of the present embodiment is a semiconductor device using an SOI (SOI Silicon On Insulator) substrate SUB.

The SOI substrate SUB includes a substrate (semiconductor substrate, support substrate) SB1 made of single crystal silicon or the like, an insulating layer (buried insulating film, buried oxide film, BOX (Buried Oxide) layer) BX made of silicon oxide or the like formed on a main surface of the substrate SB1, and a semiconductor layer (SOI layer) SM1 made of single crystal silicon or the like formed on an upper surface of the insulating layer BX. The substrate SB1 is a support substrate that supports the insulating layer BX and the structure above the insulating layer BX. The SOI substrate SUB is constituted of these substrate SB1, insulating layer BX and semiconductor layer SM1. The MISFET is formed on the main surface of the SOI substrate SUB. The case in which the MISFET is an n-channel-type MISFET will be described here.

The element isolation region (element isolation structure) ST is formed in the SOI substrate SUB. This element isolation region ST is formed of an insulator (for example, silicon oxide) buried in an element isolation trench (trench for element isolation) ST1. The element isolation trench ST1 and the element isolation region ST buried therein penetrate through the semiconductor layer SM1 and the insulating layer BX, and the bottom portion thereof reaches the substrate SB1 and the lower portion of the element isolation region ST is located inside the substrate SB1. More specifically, in this state, the element isolation region ST is buried in the element isolation trench ST1 formed through the semiconductor layer SM1, the insulating layer BX and the substrate SB1. For this reason, one portion of the element isolation region ST is located below the lower surface of the insulating layer BX.

The element isolation region ST can be formed by forming the element isolation trench ST1 which penetrates through the semiconductor layer SM1 and the insulating layer BX and whose bottom portion reaches the substrate SB1 (that is, the bottom portion is located in the substrate SB1) in the main surface of the SOI substrate SUB by using a photolithography technique, a dry etching technique or the like, and then burying an insulating film (for example, silicon oxide film) in the element isolation trench ST1 by using a film-forming technique, a CMP technique or the like.

In the SOI substrate SUB, the active region AR defined by (surrounded in a plan view by) the element isolation region ST has a structure in which the insulating layer BX and the semiconductor layer SM1 are stacked on the substrate SB1 in this order from below.

The gate electrode GE is formed on the semiconductor layer SM1 in the active region AR defined by (surrounded in a plan view by) the element isolation region ST via the gate insulating film GI.

The gate electrode GE is formed of a conductive film, and can be formed of, for example, a silicon film such as a polycrystalline silicon film (polysilicon film, doped polysilicon film). When the gate electrode GE is formed of a silicon film, an impurity is introduced to the silicon film so as to reduce the resistance thereof. In another aspect, the gate electrode GE may be formed of a metal film or a metal compound film having a metal conductivity, and in this case, the gate electrode GE forms a metal gate electrode.

The gate insulating film GI is made of, for example, a thin silicon oxide film, but a silicon oxynitride film may be used in place of a silicon oxide film. In another aspect, a high dielectric constant gate insulating film (for example, a metal oxide film such as a hafnium oxide film or an aluminum oxide film), which has a dielectric constant higher than that of silicon nitride, may be used as the gate insulating film GI.

The semiconductor layer SM1 below the gate electrode GE forms the region in which a channel of MISFET is formed (channel formation region).

On the sidewall of the gate electrode GE, a sidewall spacer (sidewall, sidewall insulating film) SW2 is formed as a sidewall insulating film via an insulating film IL2. The sidewall spacer SW2 is made of an insulating film and can be regarded as a sidewall insulating film.

The sidewall spacer SW2 is not in contact with (the sidewall of) the gate electrode GE, and the insulating film IL2 is interposed between the sidewall spacer SW2 and (the sidewall of) the gate electrode GE. Moreover, the sidewall spacer SW2 is not in contact with the semiconductor layer SM1, and the insulating film IL2 is interposed between the sidewall spacer SW2 and the semiconductor layer SM1.

On the semiconductor layer SM1, the semiconductor layer EP which is an epitaxial layer (epitaxial semiconductor layer) is formed. The semiconductor layer EP is formed on the semiconductor layer SM1 by an epitaxial growth, and is made of, for example, silicon (single crystal silicon). More specifically, the semiconductor layer EP is selectively formed on a region of the semiconductor layer SM1 which is not covered with the gate electrode GE and the insulating film IL2. The semiconductor layer EP is formed on both sides of the gate electrode GE (both sides in a gate length direction).

The semiconductor layer EP is formed on the portions of the semiconductor layer SM1 exposed from the insulating film IL2, and the semiconductor layer EP is not raised over the insulating film IL2. Moreover, the sidewall spacer SW2 is formed after the formation of the semiconductor layer EP, and the sidewall spacer SW2 is partly raised over the semiconductor layer EP. In other words, one portion of the sidewall spacer SW2 is located (positioned) on the semiconductor layer EP.

Specifically, an outer end portion of the sidewall spacer SW2 in the gate length direction is located on the semiconductor layer EP. In this case, the outer end portion of the sidewall spacer SW2 in the gate length direction refers to an end portion in a direction along (in parallel with) the gate length direction (gate length direction of the gate electrode GE, on the sidewall of which the sidewall spacer SW2 is formed) and it corresponds to an end portion on a side opposite to the side adjacent to the gate electrode GE. In other words, the end portion of the sidewall spacer SW2 on the side opposite to the side adjacent to the gate electrode GE is positioned on the semiconductor layer EP. More specifically, the portion of the sidewall spacer SW2 on the side close to the gate electrode GE is not positioned on the semiconductor layer EP, and the portion thereof on the side far from the gate electrode GE is raised over the semiconductor layer EP. From another viewpoint, one portion of the sidewall spacer SW2 is raised over the vicinity of the end portion (end portion on the side opposed to the gate electrode GE) of the semiconductor layer EP.

The semiconductor layer EP is formed on the semiconductor layer SM1, and no semiconductor layer EP is formed on the element isolation region ST. For this reason, on a border (border in a plan view) between the semiconductor layer SM1 and the element isolation region ST, a sidewall (side surface) EP1 of the semiconductor layer EP is formed. The sidewall (side surface) EP1 of the semiconductor layer EP corresponds to a sidewall (side surface) that is adjacent to the element isolation region ST when seen in a plan view. On this sidewall EP1 of the semiconductor layer EP, a sidewall spacer SW3 is formed. This sidewall spacer SW3 is formed in the same process as that of the sidewall spacer SW2. Thus, since the sidewall spacer SW3 and the sidewall spacer SW2 are formed of the same insulating film (insulating film IE4 to be described later), the sidewall spacer SW3 and the sidewall spacer SW2 are consequently formed of insulating films made of the same material. For example, when the sidewall spacer SW2 is made of a single-layer insulating film, the sidewall spacer SW3 is also made of a single-layer insulating film made of the same material, and when the sidewall spacer SW2 is made of stacked insulating films, the sidewall spacer SW3 is also made of the same stacked insulating films. In the present embodiment, in order to make the invention easily understood, the sidewall spacer SW2 and the sidewall spacer SW3 are described separately, but these are the films formed integrally. In other words, on the sidewalls and others of the gate electrode GE on the element isolation region ST of FIG. 4, the sidewall spacer SW2 and the sidewall spacer SW3 are connected to each other.

Since the sidewall EP1 of the semiconductor layer EP is adjacent to the element isolation region ST when seen in a plan view, the bottom surface (lower surface) of the sidewall spacer SW3 formed on the sidewall EP1 of the semiconductor layer EP is positioned on the element isolation region ST. In other words, the sidewall spacer SW3 is formed on the sidewall EP1 of the semiconductor layer EP, and is positioned on the element isolation region ST. Therefore, the sidewall spacer SW3 has a side surface that is opposed to the sidewall EP1 of the semiconductor layer EP and a bottom surface that is opposed to the element isolation region ST.

Moreover, although the illustration thereof is omitted in FIG. 1 and others, the sidewall spacer SW3 is formed also on the sidewall EP1 of the semiconductor layer EP in the gate length direction (on the extended line of the A-A cross-section of FIG. 4). More specifically, the sidewall spacer SW3 is formed so as to surround the semiconductor layer EP formed in the active region AR. In other words, the sidewall spacer SW3 is formed on the sidewall EP1 of the semiconductor layer EP in the gate length direction and in the gate width direction.

In the semiconductor layers SM1 and EP on the both sides (both sides in the gate length direction) of the gate electrode GE, semiconductor regions for source or drain of the MISFET are formed, and the semiconductor regions for source or drain are made up of the $n^-$-type semiconductor region EX and the $n^+$-type semiconductor region SD having an impurity concentration higher than that of the $n^-$-type semiconductor region EX. More specifically, in the stacked structure of the semiconductor layer SM1 and the semiconductor layer EP, (a pair of) the $n^-$-type semiconductor regions (extension region, LDD region) EX are formed in the regions that are spaced apart from each other with the channel formation region interposed therebetween, and (a pair of) the $n^+$-type semiconductor regions SD for source/drain having an impurity concentration higher than that of the $n^-$-type semiconductor region EX are formed on the outer side (side apart from the channel formation region) of the $n^-$-type semiconductor region EX. Since the semiconductor region for the source or drain region has the $n^-$-type semiconductor region EX and the $n^+$-type semiconductor region SD having an impurity concentration higher than that of the $n^-$-type semiconductor region EX, it has an LDD (Lightly Doped Drain) structure.

The $n^-$-type semiconductor region EX is adjacent to the channel formation region, and the $n^+$-type semiconductor region SD is formed at a position which is spaced apart from the channel formation region by a distance corresponding to the $n^-$-type semiconductor region EX and is in contact with the $n^-$-type semiconductor region EX.

When viewed in the thickness direction of the SOI substrate SUB, the $n^-$-type semiconductor region EX is formed from the semiconductor layer EP over the semiconductor layer SM1, and the $n^+$-type semiconductor regions SD is also formed from the semiconductor layer EP over the semiconductor layer SM1.

Since the semiconductor region for source or drain (corresponding to the $n^-$-type semiconductor region EX and the $n^+$-type semiconductor regions SD) is formed in the semiconductor layer EP, the semiconductor layer EP can be regarded as a semiconductor layer (epitaxial semiconductor layer) for source/drain (for forming source/drain).

On an upper portion (surface layer portion) of the $n^+$-type semiconductor region SD, a metal silicide layer MS, which is a reaction layer (compound layer) between metal and (the semiconductor layer EP constituting) the $n^+$-type semiconductor region SD, is formed. More specifically, on the upper portion of the semiconductor layer EP, the metal silicide layer MS, which is a compound layer between metal and an element constituting the semiconductor layer EP, is formed. The metal silicide layer MS is, for example, a cobalt silicide layer, a nickel silicide layer or a nickel platinum silicide layer. Moreover, in the case where the gate electrode GE is made of a silicon film, the metal silicide layer MS is formed also on an upper portion of the gate electrode GE.

On the main surface of the SOI substrate SUB, an insulating film IL5 serving as an interlayer insulating film is formed so as to cover the gate electrode GE, the sidewall spacers SW2 and SW3, the semiconductor layer EP and the metal silicide layer MS. The insulating film IL5 may be, for example, a stacked film made up of a silicon nitride film and a silicon oxide film (silicon oxide film thicker than the silicon nitride film) formed on the silicon nitride film or a single substance film of a silicon oxide film. As the silicon oxide film for the insulating film IL5, the film which is mainly made of silicon oxide and further contains one or more material selected from carbon (C), fluorine (F), nitrogen (N), boron (B) and phosphorus (P) may be used.

A contact hole CNT (not shown here) to be described later is formed in the insulating film IL5 and a plug PG (not shown here) to be described later is formed in the contact hole CNT, but the illustrations thereof are omitted here. Moreover, on the insulating film IL5, an insulating film IL6 (not shown here) to be described later and a wiring M1 (not shown here) to be described later are formed, but the illustrations thereof are omitted here.

<Manufacturing Process of Semiconductor Device>

Figure 5:
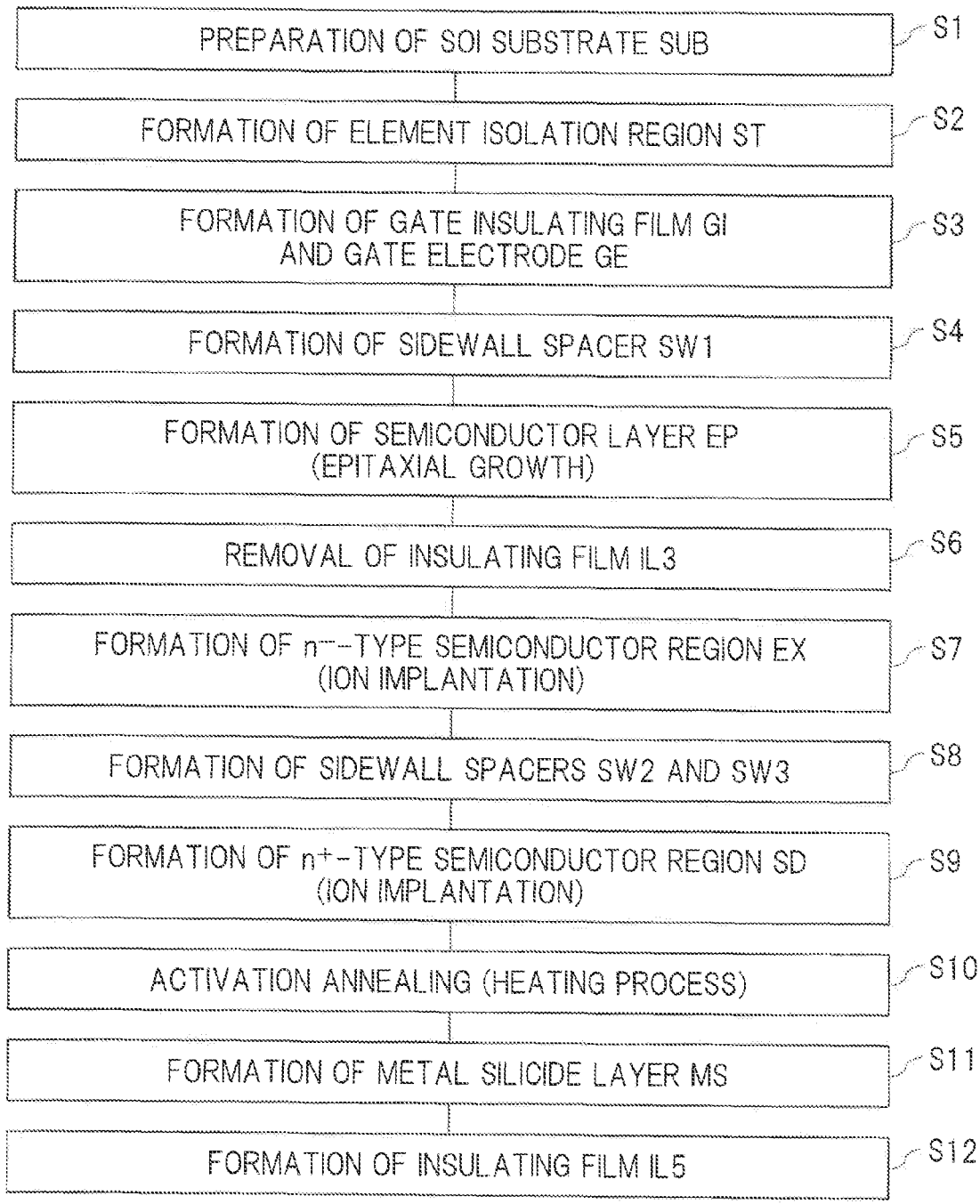
FIG. 5 is a process flow chart showing the manufacturing process of the semiconductor device of the embodiment.

Next, the manufacturing process of a semiconductor device of the present embodiment will be described with reference to the drawings. FIG. 5 is a process flow chart showing the manufacturing process of the semiconductor device of the present embodiment. FIGS. 6 to 37 are cross-sectional views showing the principal part in the manufacturing process of the semiconductor device of the present embodiment.

Figure 6:
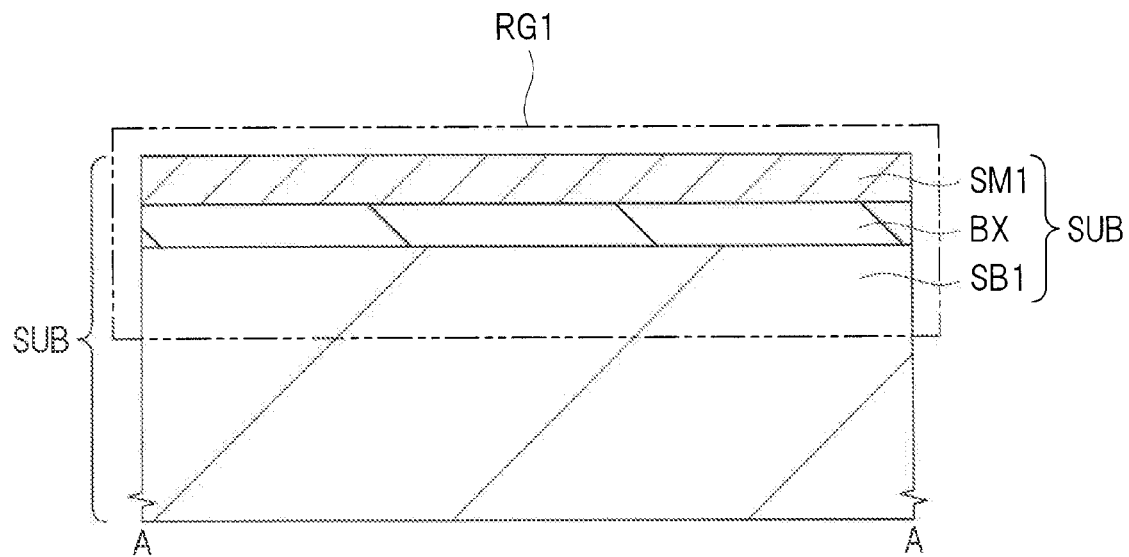
FIG. 6 is a cross-sectional view showing the principal part in the manufacturing process of the semiconductor device of the embodiment.

First, as shown in FIG. 6, an SOI substrate SUB is prepared (step S1 of FIG. 5).

The SOI substrate SUB is provided with a substrate SB1 that is made of single crystal silicon or the like and serves as a support substrate, an insulating layer BX that is made of silicon oxide or the like and is formed on the main surface of the substrate SB1, and a semiconductor layer SM1 that is made of single crystal silicon or the like and is formed on the upper surface of the insulating layer BX.

The thickness of the semiconductor layer SM1 is smaller than the thickness of the substrate SB1 serving as the support substrate. The thickness of the semiconductor layer SM1 can be set to, for example, about 3 to 20 nm.

The SOI substrate SUB can be manufactured by using various techniques. For example, the SOI substrate SUB is formed by adhering a semiconductor substrate (silicon substrate) having an oxide film formed on a surface thereof and another semiconductor substrate (silicon substrate) together by applying high temperature and pressure thereto, and then reducing the thickness of a silicon layer (silicon substrate) on one side. Alternatively, the SOI substrate SUB can be formed by using an SIMOX (Silicon Implanted Oxide) method in which ions of $O_2$ (oxygen) are implanted into a main surface of a semiconductor substrate made of Si (silicon) at high energy and Si (silicon) and oxygen are bonded to each other in a subsequent heating process, thereby forming a buried oxide film (BOX film) at a position slightly deeper than the surface of the semiconductor substrate. Moreover, it is also possible to manufacture the SOI substrate SUB by still another method, for example, a smart cut process or the like.

Figure 7:
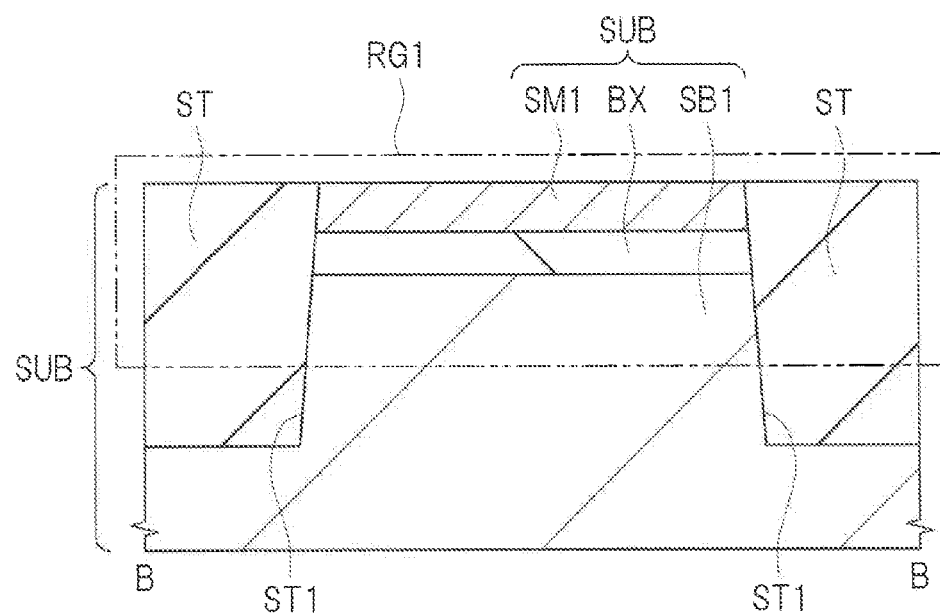
FIG. 7 is across-sectional view showing the principal part in the manufacturing process of the semiconductor device continued from FIG. 6.

Next, as shown in FIG. 7, an element isolation region ST is formed in the SOI substrate SUB (step S2 in FIG. 5).

In the formation of the element isolation region ST, for example, an element isolation trench ST1, which penetrates through the semiconductor layer SM1 and the insulating layer BX and whose bottom portion reaches the substrate SB1, is formed in the main surface of the SOI substrate SUB (semiconductor layer SM1) by using a photolithography technique, a dry etching technique or the like. Since the element isolation trench ST1 penetrates through the semiconductor layer SM1 and the insulating layer BX and the bottom Dortion of the element isolation trench ST1 reaches the substrate SB1 (the bottom portion of the element isolation trench ST1 is positioned in the middle of the thickness of the substrate SB1), the substrate SB1 is exposed at the bottom portion of the element isolation trench ST1. Then, by burying an insulating film into the element isolation trench ST1 by using a film-forming technique, a CMP technique or the like, the element isolation region ST can be formed. For example, after the insulating film is formed on the main surface of the SOI substrate SUB so as to fill the element isolation trench ST1, the insulating film outside the element isolation trench ST1 is removed by a CMP (Chemical Mechanical Polishing) method or the like, thereby forming the element isolation region ST made of the insulating film buried in the element isolation trench ST1. On the semiconductor layer SM1 constituting an active region surrounded by the element isolation region ST when seen in a plan view, a MISFET is formed in the manner described below.

Figure 8:
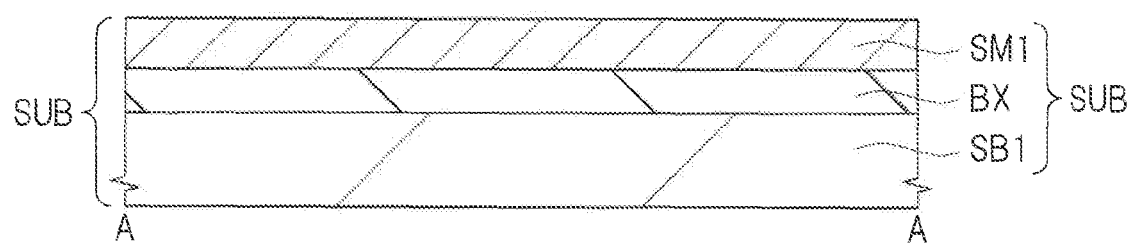
FIG. 8 is an A-A cross-sectional view in the same manufacturing process of the semiconductor device as that of FIG. 7.
Figure 9:
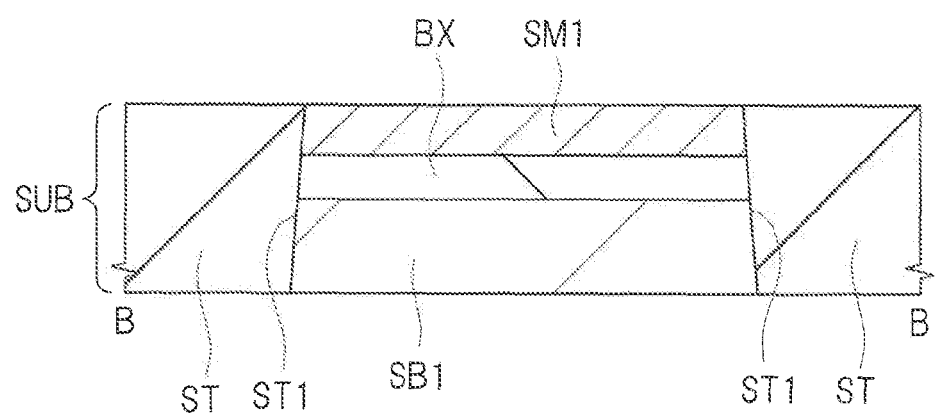
FIG. 9 is a B-B cross-sectional view in the same manufacturing process of the semiconductor device as that of FIG. 7.

FIGS. 8 and 9 are an A-A cross-sectional view (FIG. 8) and a B-B cross-sectional view (FIG. 9) respectively in a stage where the element isolation region ST has been formed in step S2. Here, the A-A cross-sectional view is a cross-sectional view corresponding to FIG. 1 and FIG. 2 mentioned above and is also the cross-sectional view at the position corresponding to the A-A line of FIG. 4. Also, the B-B cross-sectional view is a cross-sectional view corresponding to FIG. 3 mentioned above and is also the cross-sectional view at the position corresponding to the B-B line of FIG. 4. Note that, in FIGS. 8 to 46, the illustration of the SOI substrate SUB is limited to the thickness range in the region RG1 surrounded by a two-dot chain line in FIGS. 6 and 7 (that is, the surface layer portion of the SOI substrate SUB), and the illustration of the SOI substrate SUB in the deep region (region deeper than the region RG1 in FIGS. 6 and 7) is omitted.

Next, a p-type impurity (for example, boron) for forming a p-type well (p-type semiconductor region) is introduced by ion implantation or the like into the semiconductor layer SM1 in a region in which an n-channel MISFET is to be formed.

Figure 10:
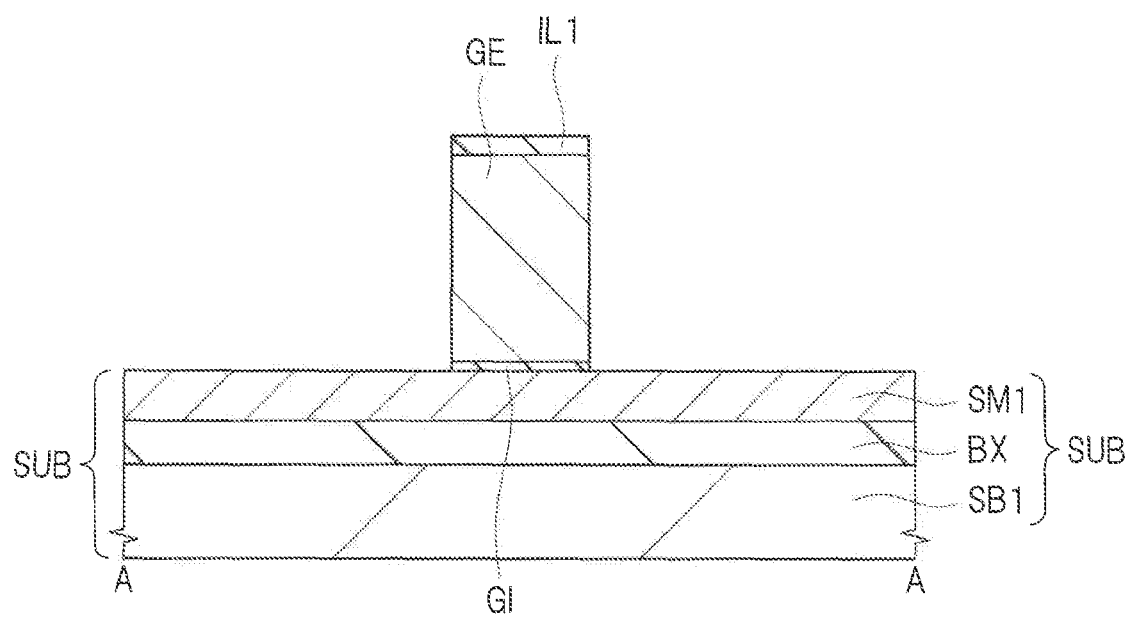
FIG. 10 is an A-A cross-sectional view in the manufacturing process of the semiconductor device continued from FIG. 8.
Figure 11:
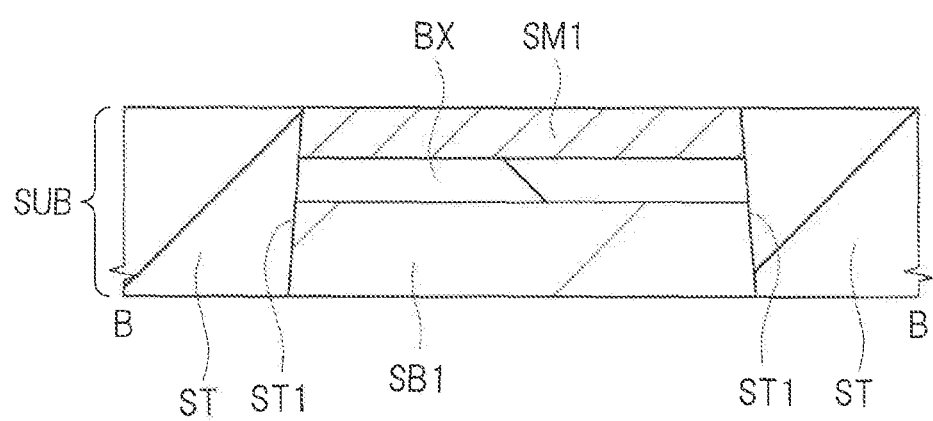
FIG. 11 is a B-B cross-sectional view in the same manufacturing process of the semiconductor device as that of FIG. 10.

Next, as shown in FIG. 10 (A-A cross-sectional view) and FIG. 11 (B-B cross-sectional view), a gate electrode GE is formed on the main surface of the SOI substrate SUE, that is, on the main surface of the semiconductor layer SM1 via a gate insulating film GI (step S3 of FIG. 5).

On the upper portion of the gate electrode GE, an insulating film IL1 is preferably formed. In the case where the insulating film ILL is formed on the gate electrode GE, it is possible to prevent an epitaxial layer from being formed on the gate electrode GE in step S5 to be described later. In contrast, in the case where no insulating film IL1 is formed on the gate electrode GE, if the gate electrode GE is made of a semiconductor (for example, polysilicon) an epitaxial layer (epitaxial semiconductor layer made of the same kind, of a semiconductor material as that of the semiconductor layer EP) can be formed on (the upper surface of) the gate electrode GE in step S5 to be described later. In the case were the epitaxial layer is formed on (the upper surface of) the gate electrode GE, a metal silicide layer MS is formed on an upper portion (upper layer portion) of the epitaxial layer on the gate electrode GE in step S11 to be described later.

A specific example of this step S3 (step of forming the gate insulating film GI and the gate electrode GE) will be described. First, after an insulating film for the gate insulating film GI (an insulating film to be the gate insulating film GI later, for example, a silicon oxide film) is formed on the main surface of the SOI substrate SUB, that is, on the main surface of the semiconductor layer SM1, a conductive film for the gate electrode GE (for example, a polysilicon film) is formed on this insulating film, and the insulating film IL1 (for example, a silicon nitride film) is formed on this conductive film. In this stage, on the semiconductor layer SM1, the insulating film for the gate insulating film GI, the conductive film for the gate electrode GE and the insulating film IL1 are stacked in this order from the bottom. Then, by patterning the stacked film of the conductive film for the gate electrode GE and the insulating film IL1 by using a photolithography technique and an etching technique, the gate electrode GE made up of the patterned conductive film (conductive film for the gate electrode GE) can be formed. The insulating film for the gate insulating film GI is left between the gate electrode GE and the semiconductor layer SM1, and this forms the gate insulating film GI. For this reason, the gate electrode GE is formed on the semiconductor layer SM1 with the gate insulating film GI interposed therebetween. Moreover, on the gate electrode GE, the insulating film IL1 patterned into almost the same planar shape as that of the gate electrode GE is formed. In other words, the gate electrode GE has a stacked structure in which the insulating film IL1 is stacked on the upper portion thereof. Moreover, when patterning the conductive film for the gate electrode GE, the insulating film IL1 can be used as a hard mask.

Further, a portion of the insulating film for the gate insulating film GI covered with the gate electrode GE is left to form the gate insulating film GI, and the other portions except for the portion covered with the gate electrode GE can be removed by dry etching to be carried out in the patterning process for the conductive film for the gate electrode GE or wet etching to be carried out after the dry etching.

Next, a sidewall spacer (sidewall, sidewall insulating film) SW1 serving as a sidewall insulating film is formed on the sidewall of the gate electrode GE (step S4 of FIG. 5).

The process of forming the sidewall spacer SW1 in step S4 can be carried out in the following manner.

Figure 12:
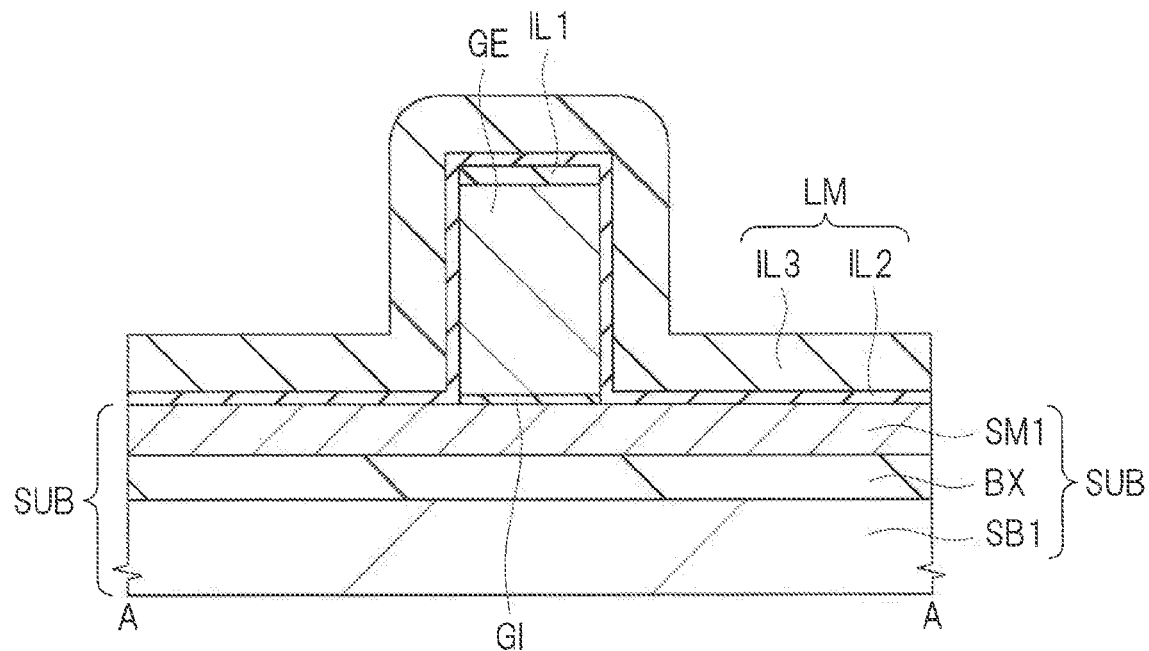
FIG. 12 is an A-A cross-sectional view in the manufacturing process of the semiconductor device continued from FIG. 10.
Figure 13:
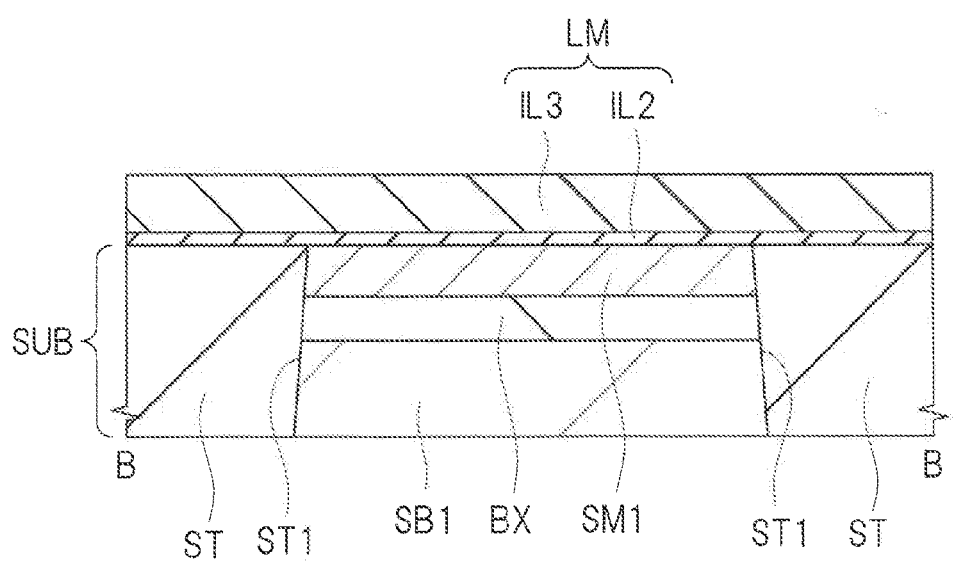
FIG. 13 is a B-B cross-sectional view in the same manufacturing process of the semiconductor device as that of FIG. 12.
Figure 14:
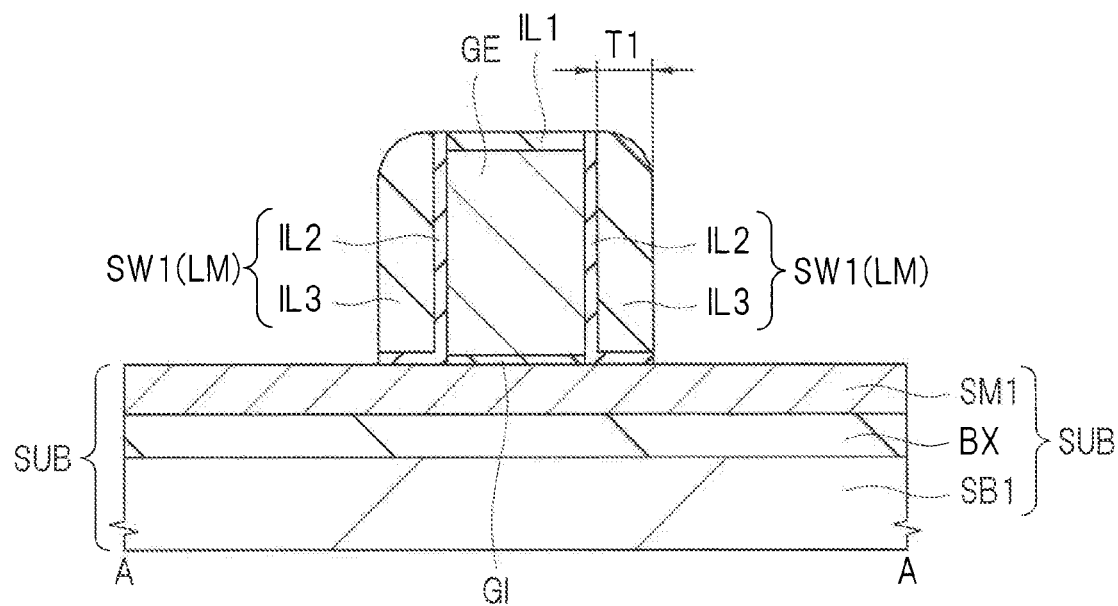
FIG. 14 is an A-A cross-sectional view in the manufacturing process of the semiconductor device continued from FIG. 12.
Figure 15:
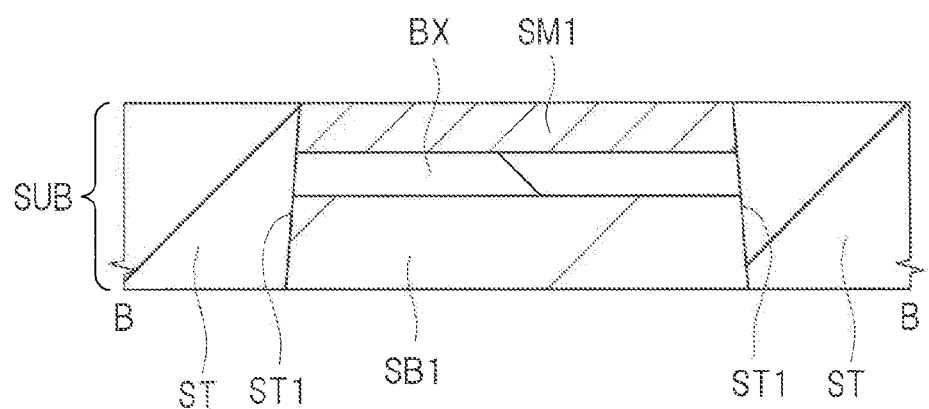
FIG. 15 is a B-B cross-sectional view in the same manufacturing process of the semiconductor device as that of FIG. 14.

First, as shown in FIG. 12 (A-A cross-sectional view) and FIG. 13 (B-B cross-sectional view) an insulating film IL2 is formed on the main surface (the entire main surface) of the SOI substrate SUB, that is, on the semiconductor layer SM1 so as to cover the gate electrode GE. Then, on the main surface (the entire main surface) of the SOI substrate SUB, that is, on the insulating film IL2, an insulating film IL3 is formed. Thus, a stacked film LM of the insulating film IL2 and the insulating film 1L3 on the insulating film IL2 is formed on the main surface of the SOI substrate SUB so as to cover the gate electrode GE. Next, as shown in FIG. 14 (A-A cross-sectional view) and FIG. 15 (B-B cross-sectional view), the sidewall spacer SW1 is formed on each of the both sidewalls of the gate electrode GE by the etching back (etching, dry etching, anisotropic etching) of the stacked film LM (stacked film LM of the insulating film IL2 and the insulating film IL3) by using an anisotropic etching technique. In this etching back process, by anisotropically etching (etching back) the stacked film LM by a portion corresponding to a deposited film thickness of the stacked film LM, the stacked film LM is left on each of the both sidewalls (side surfaces) of the gate electrode GE so as to form the sidewall spacer SW1, and the stacked film LM on the other regions is removed. In this manner, the sidewall spacer SW1 is formed from the stacked film LM left on each of the both sidewalls of the gate electrode GE.

The sidewall spacer SW1 is formed of the stacked film LM of the insulating film IL2 and the insulating film IL3 on the insulating film IL2. Specifically, the sidewall spacer SW1 is formed of the insulating film IL2 that continuously extends from the upper portion of the semiconductor layer SM1 over the sidewall of the gate electrode GE with almost uniform thickness and the insulating film IL3 that is spaced away from the semiconductor layer SM1 and the gate electrode GE with the insulating film IL2 interposed therebetween (by a distance corresponding to the insulating film IL2). More specifically, the insulating film IL2 constituting the sidewall spacer SW1 is interposed between the insulating film IL3 constituting the sidewall spacer SW1 and the semiconductor layer SM1 and between the insulating film IL3 constituting the sidewall spacer SW1 and the gate electrode GE.

The insulating film IL2 and the insulating film IL3 are made of different materials. Preferably, the insulating film IL2 is made of a silicon oxide film and the insulating film IL3 is made of a silicon nitride film. In another aspect, the insulating film IL2 may be made of a silicon nitride film and the insulating film IL3 may be made of a silicon oxide film. The insulating films IL2 and IL3 can be formed by using, for example, a CVD method.

Figure 16:
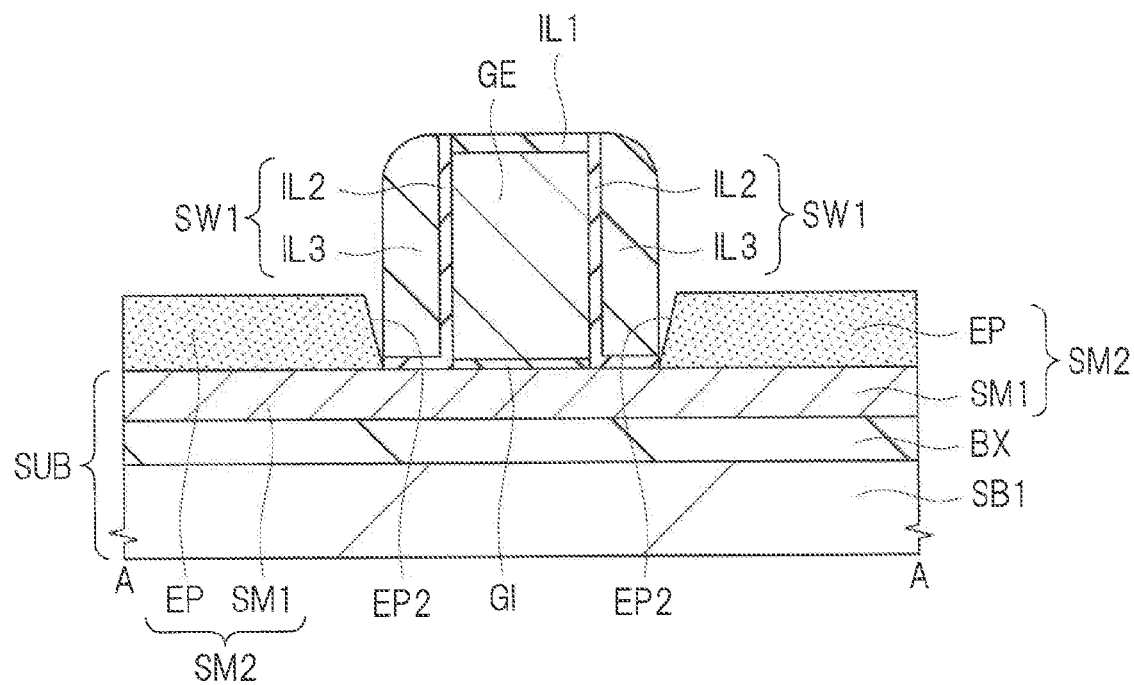
FIG. 16 is an A-A cross-sectional view in the manufacturing process of the semiconductor device continued from FIG. 14.
Figure 17:
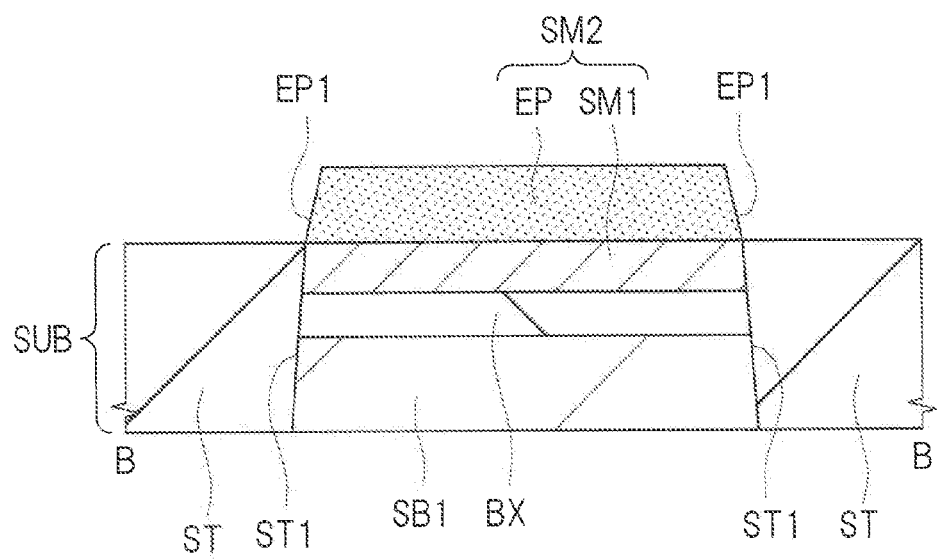
FIG. 17 is a B-B cross-sectional view in the same manufacturing process of the semiconductor device as that of FIG. 16.

Next, as shown in FIG. 16 (A-A cross-sectional view) and FIG. 17 (B-B cross-sectional view), the semiconductor layer EP which is an epitaxial layer (epitaxial growth layer or epitaxial semiconductor layer) is formed on the semiconductor layer SM1 by epitaxial growth (step S5 in FIG. 5). More specifically, on the semiconductor layer SM1, the semiconductor layer EP is epitaxially grown. Note that, in FIGS. 16 and 17, the semiconductor layer EP is hatched with dots.

Since the semiconductor layer EP is formed by the epitaxial growth in step S5, the epitaxial layer (semiconductor layer EP) is selectively grown on the exposed surface (Si surface) of the semiconductor layer SM1. On the insulating film, the epitaxial layer is not grown. Accordingly, in step S5, on a region (exposed surface) of the main surface (surface) of the semiconductor layer SM1 that is not covered with the gate electrode GE and the sidewall spacer SW1, the epitaxial layer (epitaxial layer to be the semiconductor layer EP) is selectively grown.

Therefore, the semiconductor layer EP is formed on the semiconductor layer SM1 on both sides of the gate electrode GE (more specifically, in the regions on both sides of a structure composed of the gate electrode GE and the sidewall spacer SW1 formed on the sidewall thereof). In other words, on the semiconductor layer SM1, the semiconductor layer EP is formed on both sides of the gate electrode GE (more specifically, on both sides of the structure composed of the gate electrode GE and the sidewall spacer SW1 formed on the sidewall thereof) so as to be adjacent to the gate electrode GE (more specifically, to be adjacent to the structure composed of the gate electrode GE and the sidewall spacer SW1 formed on the sidewall thereof). The semiconductor layer EP is formed so as to be spaced apart from the gate electrode GE by a distance corresponding to the sidewall spacer SW1 (spaced apart in the gate length direction of the gate electrode GE).

The semiconductor layer EP is an epitaxial layer (epitaxial semiconductor layer) formed by an epitaxial growth, and is made of, for example, silicon (single crystal silicon). The semiconductor layer EP is epitaxially grown selectively on an exposed surface of the semiconductor layer SM1 (that is, on the upper surface of the semiconductor layer SM1 that is not covered with the gate electrode GE and the sidewall spacer SW1), and is not formed on the sidewall spacer SW1, the insulating film IL1 and the element isolation region ST.

When the semiconductor layer EP is epitaxially grown, since the upper surface of the gate electrode GE is covered with the insulating film IL1 and the side surface (sidewall) thereof is covered with the sidewall spacer SW1, it is possible to prevent an epitaxial layer from being formed on the surface of the gate electrode GE even when the gate electrode GE is formed of a polysilicon film. Note that, in another aspect, when it is desired that the gate electrode GE is formed of a semiconductor film (for example, polysilicon film) and a semiconductor layer of the same kind as the semiconductor layer EP is epitaxially grown on the upper surface of the gate electrode GE in step S5, the formation of the insulating film IL1 on the gate electrode GE may be omitted.

Since the semiconductor layer EP is formed on the almost flat upper surface of the semiconductor layer SM1, the upper surface of the semiconductor layer EP is located at a position higher than the upper surface of the semiconductor layer SM1. Therefore, the upper surface of the semiconductor layer EP formed in step S5 is located at a position higher than the upper surface of the semiconductor layer SM1 right below the gate electrode GE. Note that, when the height is mentioned, it corresponds to a height in a direction almost perpendicular to the main surface of the SOI substrate SUB.

Moreover, when the underlying semiconductor region has a high impurity concentration, the epitaxial layer is less likely to grow and its growth rate tends to become slower. By forming the semiconductor layer EP in step S5 prior to the ion implanting process for forming the n⁻-type semiconductor region EX to be described later (corresponding to step S7 to be described later) and the ion implanting process for forming the n⁺-type semiconductor region SD to be described later (corresponding to step S9 to be described later), the impurity concentration of the underlying layer (semiconductor layer SM1 in this case) of the semiconductor layer EP can be lowered at the time of epitaxially growing the semiconductor layer EP. In this manner, the semiconductor layer EP can be easily grown, and the growth rate of the semiconductor layer EP can be increased.

Moreover, there may be a case in which the sidewalls (EP1, EP2) of the semiconductor layer EP are almost perpendicular to the main surface of the SOI substrate SUB (in this case, the sidewall of the semiconductor layer EP and the upper surface of the semiconductor layer SM1 form an almost right angle) and a case in which they are slanted (in this case, the sidewall of the semiconductor layer EP and the upper surface of the semiconductor layer SM1 form an acute angle).

Note that the structure in which the semiconductor layer SM1 and the semiconductor layer EP formed on the semiconductor layer SM1 are combined with each other is hereinafter referred to as a semiconductor layer SM2.

Figure 18:
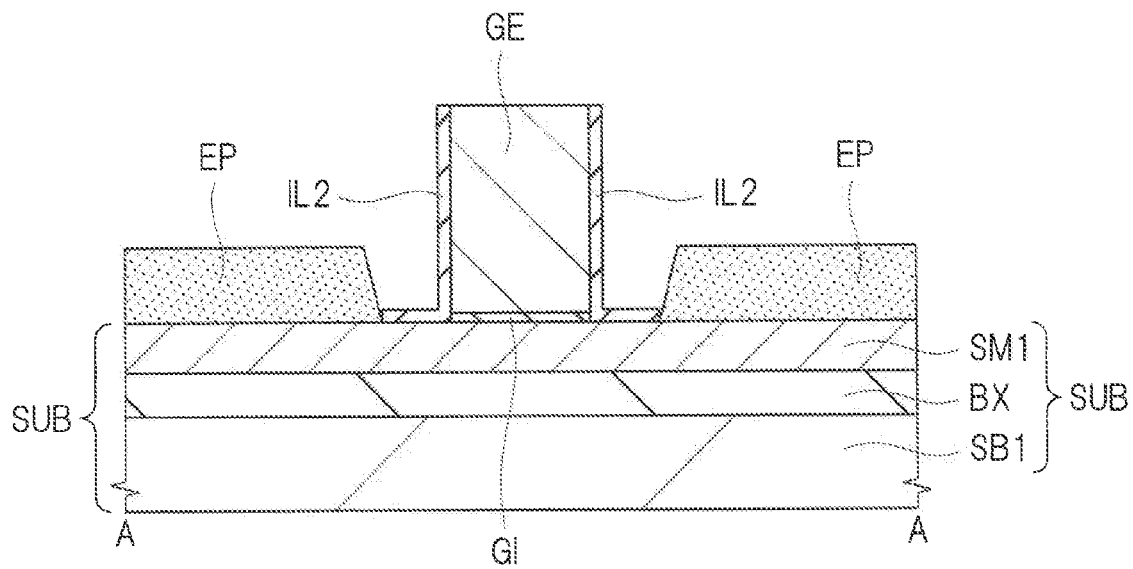
FIG. 18 is an A-A cross-sectional view in the manufacturing process of the semiconductor device continued from FIG. 16.
Figure 19:
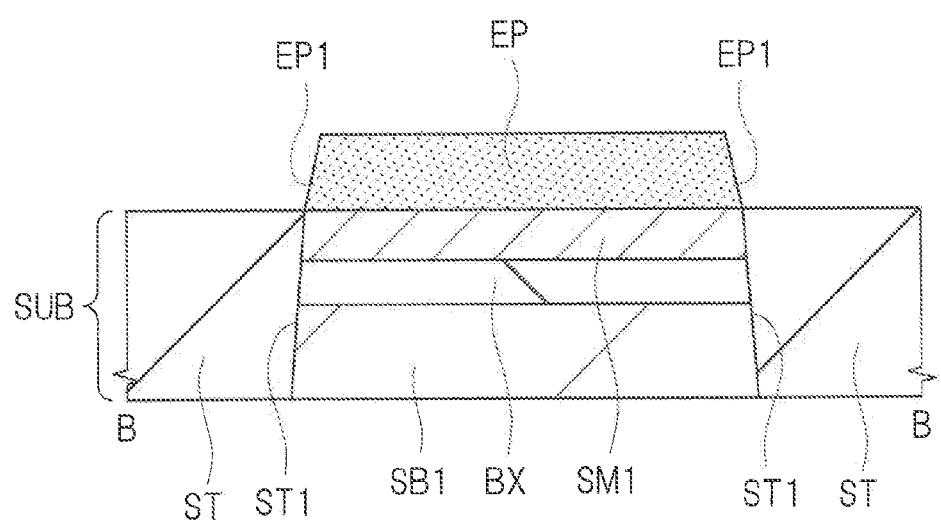
FIG. 19 is a B-B cross-sectional view in the same manufacturing process of the semiconductor device as that of FIG. 18.

Next, as shown in FIG. 18 (A-A cross-sectional view) and FIG. 19 (B-B cross-sectional view), the insulating film IL3 constituting the sidewall spacer SW1 is removed by etching (step S6 in FIG. 5). By the etching in stop SE, the insulating film IL3 constituting the sidewall spacer SW1 is removed, so that the insulating film IL2 constituting the sidewall spacer SW1 is exposed.

In this step S6, the etching is carried out under such a condition (etching condition) that the etching rate of the insulating film IL3 is higher (faster) than the etching rate of the insulating film IL2. In other words, in step S6, the etching is carried out under such a condition (etching condition) that the etching rate of the insulating film IL2 is lower (slower) than the etching rate of the insulating film IL3. More specifically, in step S6, the etching is carried out under such an etching condition that the insulating film IL2 is less likely to be etched in comparison with the insulating film IL3. Since the insulating film IL2 and the insulating film IL3 are made of different materials, the etching selectivity of the insulating film IL3 relative to the insulating film IL2 can be properly ensured.

For this reason, in the etching process in step S6, the insulating film IL3 constituting the sidewall spacer SW1 is removed by etching, and the insulating film IL2 constituting the sidewall spacer SW1 can be made to function as an etching stopper film. Thus, in step S6, the insulating film IL2, constituting the sidewall spacer SW1 is left without being removed.

Note that, depending on the etching conditions of step S6, a surface layer portion (upper layer portion) of the insulating film IL2 that has been exposed by removing the insulating film IL3 constituting the sidewall spacer SW1 is sometimes removed by the etching. Even in this case, however, it is preferable to set the etching condition in step S6 so that the insulating film IL2 is not completely removed and the insulating film IL2 is left in a layer form. In other words, although the thickness of the insulating film IL2 is not changed before and after step S6 or the thickness of the insulating film IL2 after step S6 is smaller than that before step S6, the insulating film IL2 is preferably left in a layer form even after step S6 so that portions of the semiconductor layer SM1 and the sidewall of the gate electrode GE covered with the insulating film IL2 constituting the sidewall spacer SW1 are not exposed. In this manner, even when the insulating film IL3 constituting the sidewall spacer SW1 is removed in step S6, the state in which the insulating film IL2 continuously extends (in a layer form) from the sidewall of the gate electrode GE over the semiconductor layer SM1 is maintained.

Moreover, in step S6, it is preferable to prevent the semiconductor layer EP from being etched as far as possible. For this reason, in step S6, the etching is preferably carried out under such a condition (etching condition) that the etching rate of the semiconductor layer EP is lower (slower) than the etching rate of the insulating film IL3. In other words, in step S6, it is preferable to carry out the etching under such a condition (etching condition) that the etching rate of the insulating film IL3 is higher (faster) than the etching rate of the semiconductor layer EP. More specifically, in step S6, the etching is preferably carried out under such an etching condition that the semiconductor layer EP is less likely to be etched in comparison with the insulating film IL3. In this manner, in step S6, the insulating film IL3 constituting the sidewall spacer SW1 is removed by etching, and the semiconductor layer EP is prevented or suppressed from being etched.

Therefore, in step S6, it is preferable to carry out the etching under such an etching condition that the insulating film IL2 and the semiconductor layer EP are less likely to be etched in comparison with the insulating film IL3.

In step S6, an etching method capable of selectively etching the insulating film IL3 is preferably used, and the wet etching is preferably used. Silicon nitride can be etched with a high selectivity with respect to silicon oxide, silicon and others, and the wet etching can be desirably used in this case. For this reason, in the case where the insulating film IL3 is made of silicon nitride and the insulating film IL2 is made of silicon oxide, the insulating film IL3 is etched and removed by the wet etching, and the etching of the insulating film IL2 and the semiconductor layer EP can be properly Suppressed or prevented. Accordingly, the insulating film IL2 and the insulating film IL3 are made of different materials, and the combination in which a silicon oxide film is used as the insulating film IL2 and a silicon nitride film is used as the insulating film IL3 can be preferably used.

In other words, it is preferable to select, the materials of the insulating film IL2 and the insulating film IL3 so as to ensure the high etching selectivity of the insulating film IL3 with respect to the semiconductor layer EP and the insulating film IL2, and from this point of view, it is preferable to use a silicon oxide film for the insulating film IL2 and use a silicon nitride film for the insulating film IL3.

Moreover, if the insulating film IL1 on the gate electrode GE is formed by using the same material as that of the insulating film IL3, it is possible to remove the insulating film IL1 on the gate electrode GE by etching simultaneously with the removal of the insulating film IL3 constituting the sidewall spacer SW1 by etching in step S6. In the case where the insulating film IL1 on the gate electrode GE is preliminarily removed, the metal silicide layer MS can be formed on the upper portion of the gate electrode GE in step S11 to be described later.

Also, since the semiconductor layer EP is formed on one portion of the semiconductor layer SM1 which is not covered with the gate electrode GE and the sidewall spacer SW1 in step S5 and the insulating film IL3 constituting the sidewall spacer SM1 is then removed in step S6, the semiconductor layer SM1 is not raised over the insulating film IL2 (the insulating film IL2 constituting the sidewall spacer SW1) left after step S6. More specifically, although the side surface of the semiconductor layer EP is adjacent to (or close to) the end portion of the insulating film IL2, the semiconductor layer EP is not formed on one portion of the insulating film IL2 extending on the semiconductor layer SM1.

In the present embodiment, one portion of the sidewall spacer SW1 (the insulating film IL3 in this case) is removed in step S6, and another portion (the insulating film IL2 in this case) is left. In another aspect, it is also possible to remove the entire sidewall spacer SW1 in step S6. When both of the cases are expressed together, at least one portion of the sidewall spacer SW1 is removed in step S6.

However, in comparison with the case in which the entire sidewall spacer SW1 is removed in step S6, the following advantages can be obtained in the case where one portion of the sidewall spacer SW1 (the insulating film IL3 in this case) is removed in step S6 and another portion (the insulating film IL2 in this case) is left. That is, it is possible to prevent the semiconductor layer SM1 and the gate electrode GE from being exposed to be over-etched. Moreover, since the portion of the sidewall spacer SW1 left on the sidewall of the gate electrode GE without being removed in step S6 can be made to function as an ion implantation blocking mask together with the gate electrode GE (that is, the remaining portion can be made to function as an offset spacer) in step S7 to be described later, it is possible to control the overlapping amount between the $n^-$-type semiconductor region EX and the gate electrode GE. In the case where one portion of the sidewall spacer SW1 (the insulating film IL3 in this case) is removed and another portion (the insulating film IL2 in this case) is left in step S6, the sidewall spacer SW1 is preferably formed as a stacked film LM having the insulating films IL2 and IL3, and in this manner, the removed portion (the insulating film IL3) and the remaining portion (the insulating film IL2) of the sidewall spacer SW1 can be properly determined in step S6.

Figure 20:
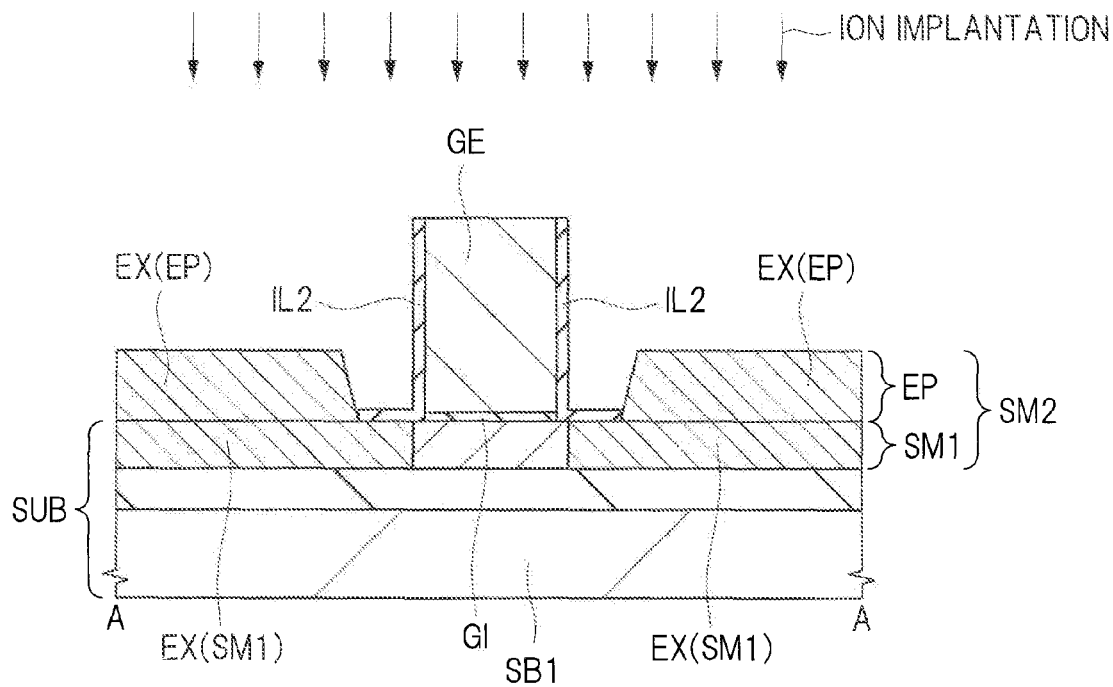
FIG. 20 is an A-A cross-sectional view in the manufacturing process of the semiconductor device continued from FIG. 18.
Figure 21:
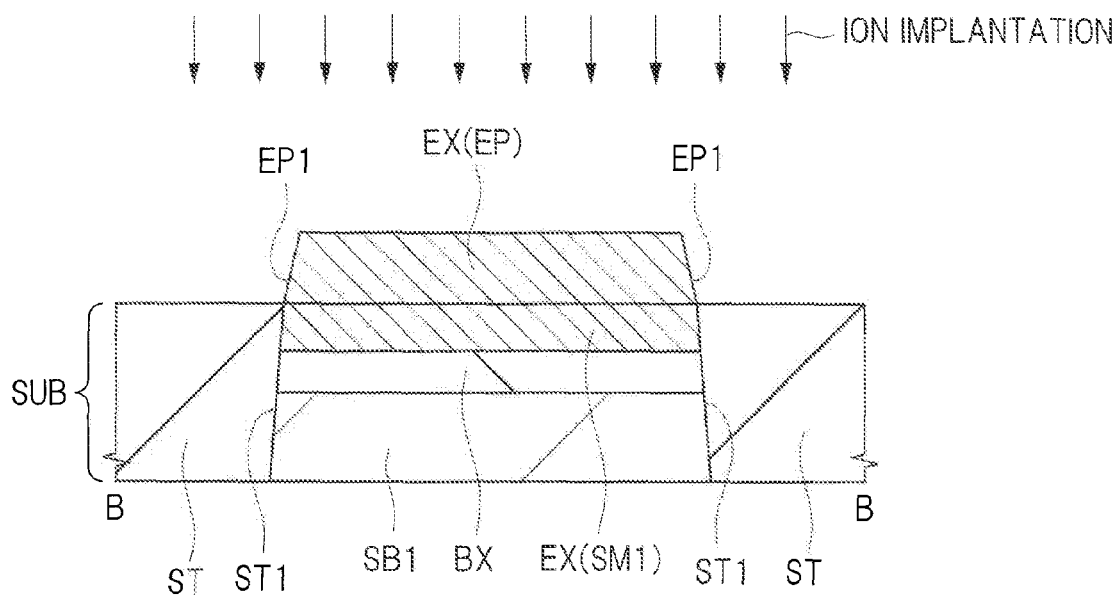
FIG. 21 is a B-B cross-sectional view in the same manufacturing process of the semiconductor device as that of FIG. 20.

Next, as shown in FIG. 20 (A-A cross-sectional view) and FIG. 21 (B-B cross-sectional view), an n-type impurity such as phosphorus (P) or arsenic (As) is ion-implanted into regions on the both sides of the gate electrode GE in the semiconductor layer SM2 (that is, semiconductor layers SM1 and EP), thereby forming the $n^-$-type semiconductor region (extension region, LDD region) EX (step S7 in FIG. 5).

Note that, in FIGS. 20 and 21, the ion implantation is schematically indicated by arrows. Moreover, in FIGS. 20 and 21, in order to make the region where the impurity (dopant) has been implanted by the ion implantation in step S7 (that is, the $n^-$-type semiconductor region EX) easily understood, the entire region where the impurity (dopant) has been implanted by the ion implantation in step S7 (that is, the $n^-$-type semiconductor region EX) is hatched with the same pattern. Moreover, in FIGS. 22 to 25 to be described later, in order to make the drawings easy to see, the hatching indicating the $n^-$-type semiconductor region EX is omitted, the entire semiconductor layer EP is hatched with dots (hatching with the same pattern as that of the semiconductor layer EP of FIGS. 16 to 19), and the entire semiconductor layer SM1 is hatched with diagonal lines (hatching with the same pattern as that of the semiconductor layer SM1 of FIGS. 6 to 19). Actually, however, in FIGS. 22 to 25 as well, the $n^-$-type semiconductor region EX is formed in almost the same region as that of FIGS. 20 and 21.

In the ion implantation of step S7 (ion implantation for forming the $n^-$-type semiconductor region EX), the gate electrode GE can function as a mask (ion implantation blocking mask). Moreover, the portion of the insulating film IL2 that extends on the sidewall of the gate electrode GE can also function as a mask (ion implantation blocking mask). Since the portion of the insulating film IL2 that extends on the semiconductor layer SM1 is so thin in thickness (thickness in a direction almost perpendicular to the main surface of the SOI substrate SUB), the impurity ions can pass through it (that is, the implantation energy of the ion implantation is set to a value that allows the implanted ions to pass through the portion of the insulating film IL2 that extends on the semiconductor layer SM1).

For this reason, by the ion implantation in step S7, the $n^-$-type semiconductor region EX is formed in a self-aligned manner with respect to the portion of the insulating film IL2 that extends on the sidewall of the gate electrode GE in (the stacked body of) the semiconductor layer SM1 and the semiconductor layer EP.

In the present embodiment, since the ion implantation in step S7 is carried out in a state where the insulating film IL2 is formed on the sidewall of the gate electrode GE, thereby forming the $n^-$-type semiconductor region EX, the insulating film IL2 on the sidewall of the gate electrode GE can function as an offset spacer. The overlapping amount between the $n^-$-type semiconductor region EX and the gate electrode GE can be controlled by the thickness of the portion of the insulating film IL2 that extends on the sidewall of the gate electrode GE. In this case, the overlapping amount between the $n^-$-type semiconductor region EX and the gate electrode GE corresponds to the size (size in the gate length direction) of the potion of the $n^-$-type semiconductor region EX located right below the gate electrode GE.

Next, on the sidewall of the gate electrode GE and on the sidewall of the semiconductor layer EP, sidewall spacers (sidewalls, sidewall insulating films) SW2 and SW3 are formed as sidewall insulating films (step S8 in FIG. 5).

The forming process of the sidewall spacers SW2 and SW3 in step S8 is carried out in the following manner.

Figure 22:
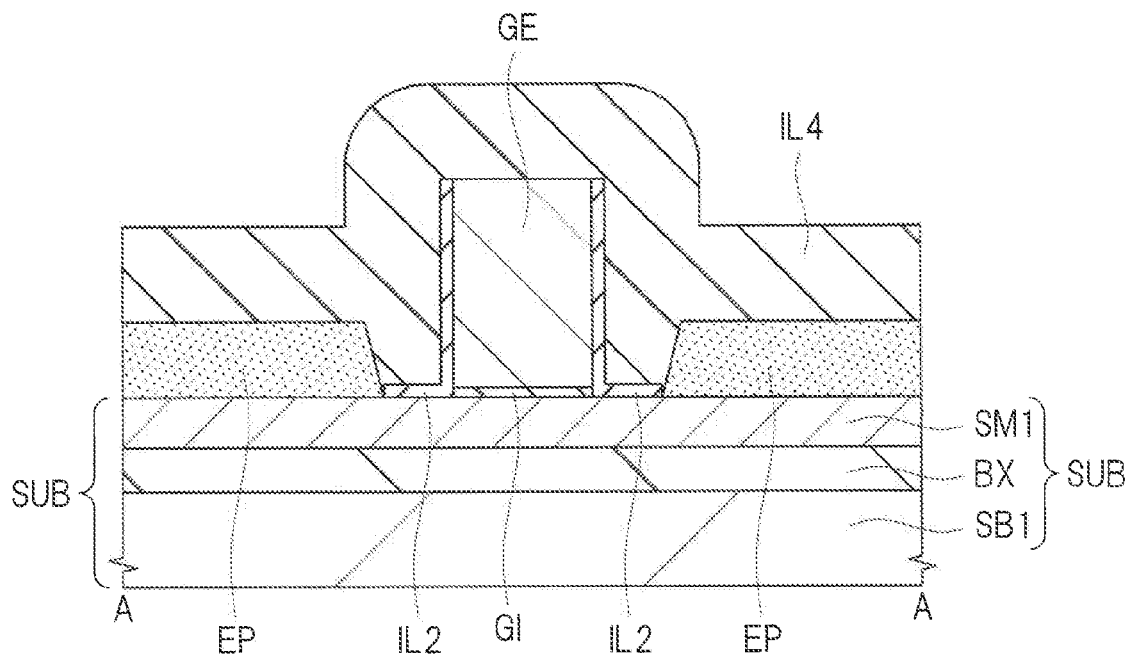
FIG. 22 is an A-A cross-sectional view in the manufacturing process of the semiconductor device continued from FIG. 20.
Figure 23:
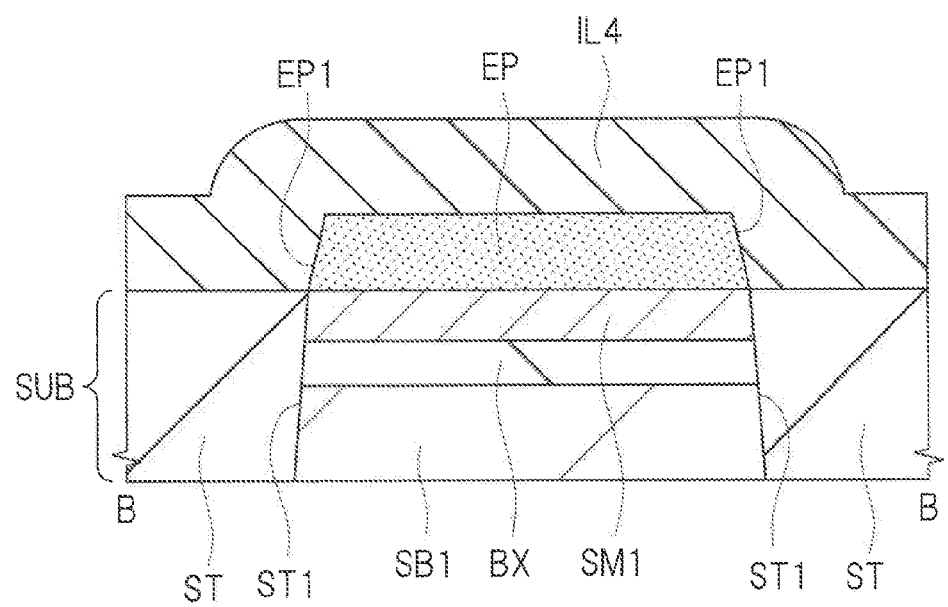
FIG. 23 is a B-B cross-sectional view in the same manufacturing process of the semiconductor device as that of FIG. 22.
Figure 24:
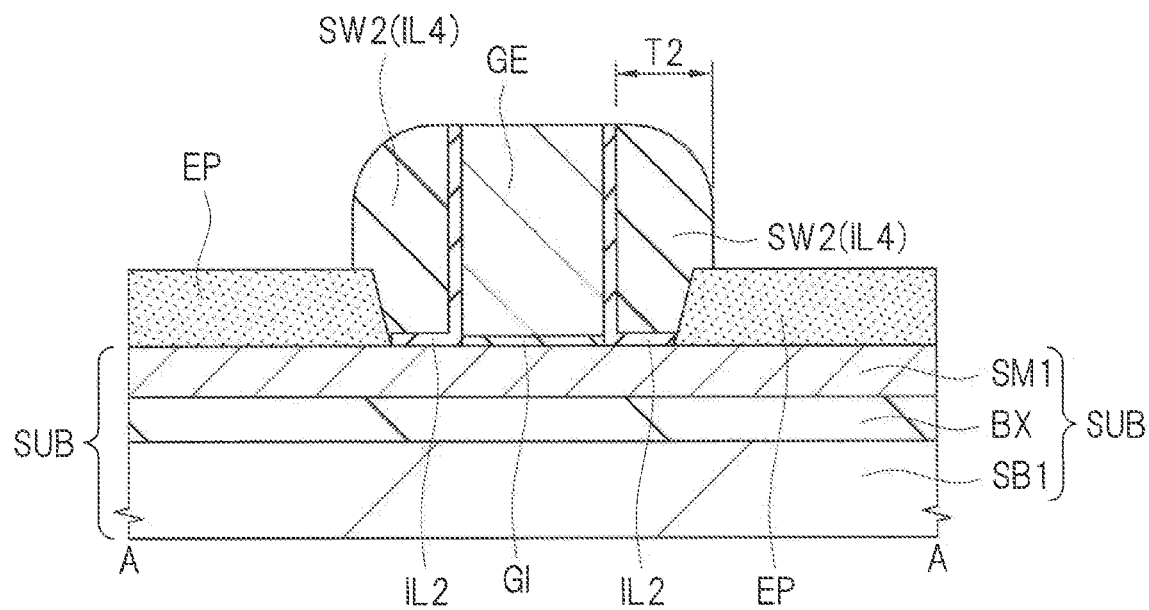
FIG. 24 is an A-A cross-sectional view in the manufacturing process of the semiconductor device continued from FIG. 22.

First, as shown in FIG. 22 (A-A cross-sectional view) and FIG. 23 (B-B cross-sectional view), an insulating film IL4 for forming the sidewall spacers SW2 and SW3 is formed on the main surface (the entire main surface) of the SOI substrate SUB so as to cover the gate electrode GE and the semiconductor layer EP. The insulating film IL4 for forming the sidewall spacers SW2 and SW3 may be an insulating film of a single layer (single-layer film) or a multi-layer insulating film (stacked film). In the case of the single layer, for example, a single-layer film of silicon nitride can be used, and in the case of the multiple layers, for example, a stacked film including a silicon oxide film and a silicon nitride film formed thereon can be used. Then, as shown in FIG. 24 (A-A cross-sectional view) and FIG. 25 (B-B cross-sectional view), by the etching back (etching, dry etching, anisotropic etching) of the insulating film IL4 by using an anisotropic etching technique, the sidewall spacer SW2 is formed on the sidewall of the gate electrode GE, and the sidewall spacer SW3 is formed on the sidewall of the semiconductor layer EP.

In this etching back process, the insulating film IL4 is anisotropically etched (etched back) by the amount corresponding to the deposited film thickness of the insulating film IL4, so that the insulating film IL4 is left on the sidewall of the gate electrode GE to form the sidewall spacer SW2 and the insulating film IL4 is left on the sidewall of the semiconductor layer EP to form the sidewall spacer SW3, while the insulating film IL4 in the other regions is removed.

Since the insulating film IL2 is formed on the sidewall of the gate electrode GE in a stage immediately before step S8, the sidewall spacer SW2 is formed on the sidewall of the gate electrode GE in step S8 with the insulating film IL2 interposed therebetween. More specifically, the insulating film IL2 is interposed between the sidewall spacer SW2 and (the sidewall of) the gate electrode GE. Moreover, the insulating film IL2 is interposed between the sidewall spacer SW2 and the semiconductor layer SM1. Accordingly, when the sidewall spacer SW2 has been formed, the insulating film IL2 is brought into a state of extending over the two regions of a region between the semiconductor layer SM1 and the sidewall spacer SW2 and a region between the gate electrode GE and the sidewall spacer SW2. Furthermore, the sidewall spacer SW2 is formed above the n⁻-type semiconductor region EX formed in the semiconductor layer SM2 (that is, the semiconductor layers SM1 and EP), and the insulating film IL2 is interposed between the sidewall spacer SW2 and one portion of the n⁻-type semiconductor region EX.

One portion of the sidewall spacer SW2 formed in step S8 is raised over the semiconductor layer EP. Thus, one portion of the sidewall spacer SW2 is located on the semiconductor layer EP. More specifically, the outer end portion of the sidewall spacer SW2 in the gate length direction is positioned on the semiconductor layer EP. In other words, the end portion of the sidewall spacer SW2 on a side opposite to the side adjacent to the gate electrode GE is positioned on the semiconductor layer EP. That is to say, in the sidewall spacer SW2, the side closer to the gate electrode GE is not positioned on the semiconductor layer EP, but the side farther from the gate electrode GE is raised over the semiconductor layer EP. From another viewpoint, one portion of the sidewall spacer SW2 is raised over the vicinity of the end portion (end portion on the side opposed to the gate electrode GE) of the semiconductor layer EP.

In order to have one portion of the sidewall spacer SW2 raised over the semiconductor layer EP, the thickness T2 of the sidewall spacer SW2 formed in step S8 is made larger (thicker) than the thickness T1 of the insulating film IL3 constituting the above-mentioned sidewall spacer SW1 (that is, the insulating film IL3 removed in the above-mentioned step S6) (T1<T2).

In this case, the thickness T2 of the sidewall spacer SW2 corresponds to the thickness (size) in a direction along the gate length direction (corresponds to the thickness in the gate length direction of the gate electrode GE, on the sidewall of which the sidewall spacer SW2 is formed), and is indicated in FIG. 24. The thickness T2 of the sidewall spacer SW2 can be controlled by adjusting the film thickness (deposited film thickness) of the insulating film IL4 for forming the sidewall, spacers SW2 and SW3 at the time of its film formation. Moreover, the thickness T1 of the insulating film IL3 constituting the sidewall spacer SW1 corresponds to the thickness (size) in a direction along the gate length direction (corresponds to the thickness in the gate length direction of the gate electrode GE, on the sidewall of which the sidewall spacer SW1 is formed), and is indicated in FIG. 14. Therefore, the measuring direction of the thickness T2 and the measuring direction of the thickness T1 are the same. The thickness T1 of the insulating film IL3 constituting the sidewall spacer SW1 can be controlled by adjusting the film thickness (deposited film thickness) of the insulating film IL3 at the time of its film formation. Accordingly, the film thickness (deposited film thickness) of the insulating film IL4 for forming the sidewall spacers SW2 and SW3 at the time of its film formation is preferably made larger (thicker) than the film thickness (deposited film thickness) of the insulating film IL3 at the time of its film formation.

Moreover, in the SOI substrate SUB, since the element isolation region ST has been formed, the semiconductor layer SM1 is divided into a plurality of sections (that is, active regions), and the semiconductor layer SM1 constituting each of the active regions is in a state of being surrounded by the element isolation region ST. Then, on the semiconductor layer SM1 constituting each active region, the MISFET is formed through the above-mentioned process and the process to be described later.

In step S5, since the semiconductor layer EP is grown on the semiconductor layer SM1 and is not grown on the element isolation region ST, a sidewall (side surface) EP1 of the semiconductor layer EP is formed on a border (border when seen in a plan view) between the semiconductor layer SM1 and the element isolation region ST. The sidewall (side surface) EP1 of the semiconductor layer EP is a sidewall (side surface) adjacent to the element isolation region ST when seen in a plan view. Moreover, in step S8, the sidewall spacer SW3 is formed on the sidewall EP1 of the semiconductor layer EP. Since the sidewall EP1 of the semiconductor layer EP is adjacent to the element isolation region ST when seen in a plan view, the bottom surface (lower surface) of the sidewall spacer SW3 formed on the sidewall EP1 of the semiconductor layer EP is positioned on the element isolation region ST. More specifically, the sidewall spacer SW3 is formed on the sidewall EP1 of the semiconductor layer EP, and is positioned on the element isolation region ST. In other words, the sidewall spacer SW3 is positioned on the element isolation region ST, and is adjacent to the sidewall EP1 of the semiconductor layer EP. Accordingly, the sidewall spacer SW3 has a side surface opposed to the sidewall EP1 of the semiconductor layer EP and a bottom surface opposed to the element isolation region ST.

Figure 25:
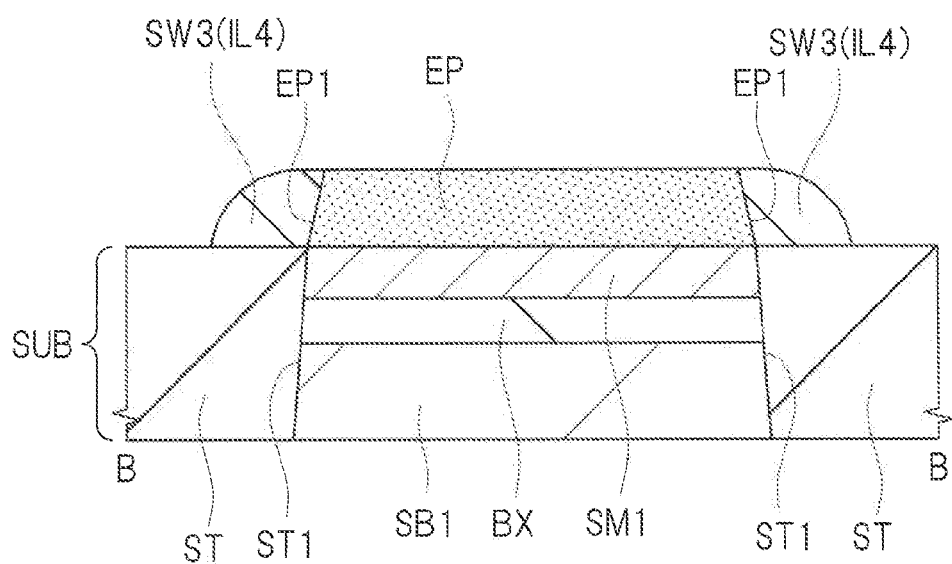
FIG. 25 is a B-B cross-sectional view in the same manufacturing process of the semiconductor device as that of FIG. 24.
Figure 39:
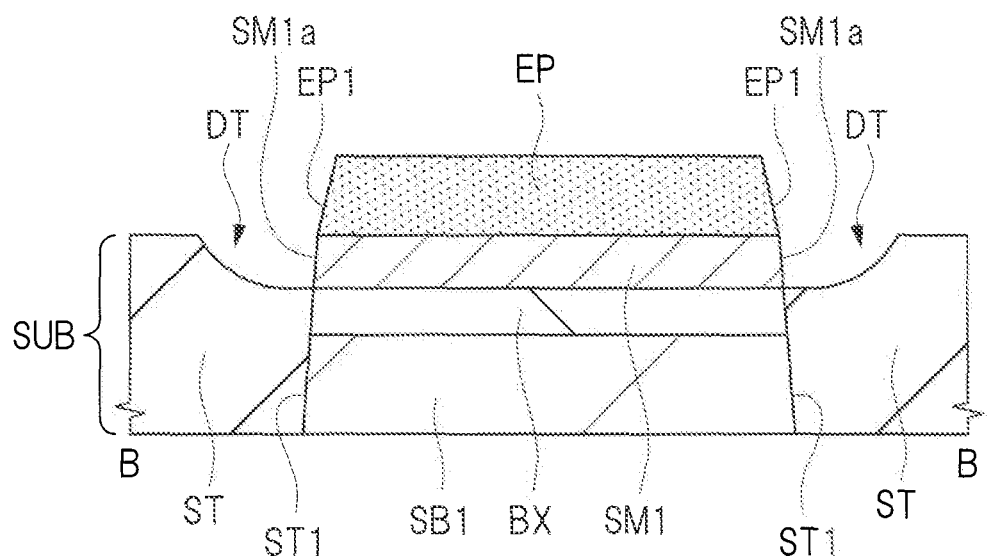
FIG. 39 is a cross-sectional view showing the principal part in the manufacturing process of the semiconductor device of the first examination example continued from FIG. 38.
Figure 42:
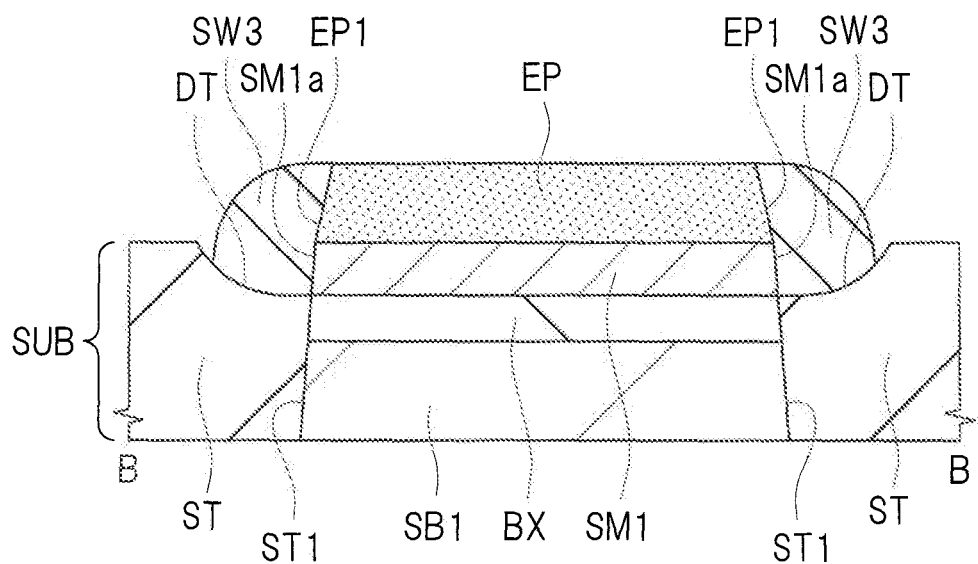
FIG. 42 is a cross-sectional view showing the principal part of the semiconductor device according to the embodiment.

At the position adjacent to the element isolation region ST, the sidewall EP1 of the semiconductor layer EP is located and the sidewall spacer SW3 is formed on the sidewall EP1 of the semiconductor layer EP, and as shown in FIG. 25, the sidewall spacer SW3 is formed on the sidewall EP1 of the semiconductor layer EP and is positioned on the element isolation region ST. However, in the case where a divot (DT) corresponding to a recessed portion is formed in the element isolation region ST as shown in FIG. 39 to be described later, not only the sidewall EP1 of the semiconductor layer EP, but also the side surface SM1a of the semiconductor layer SM1 is exposed in a region adjacent to the divot (DT) (this will be described again later). In this case, when the sidewall spacer SW3 is formed on the sidewall EP1 of the semiconductor layer EP, in the region adjacent to the divot (DT) of the element isolation region ST, the sidewall spacer SW3 is formed on the sidewall EP1 of the semiconductor layer EP, is positioned on the element isolation region ST, and also covers the side surface SM1a of the semiconductor layer SM1 as shown in FIG. 42 to be described later. Since the side surface SM1a of the semiconductor layer SM1 is covered with the sidewall spacer SW3, it is possible to prevent a metal silicide layer MS from being formed in step S11 to be described later.

The sidewall spacer SW2 and the sidewall spacer SW3 are formed in the same process by using the same insulating film IL4. Therefore, in the case where the sidewall spacer SW2 is made of, for example, a silicon nitride film, the sidewall spacer SW3 is also made of a silicon nitride film. Also, in the case where the sidewall spacer SW2 is made of, for example, a stacked film of a silicon oxide film and a silicon nitride film, the sidewall spacer SW3 is also made of a stacked film of a silicon oxide film and a silicon nitride film.

Figure 26:
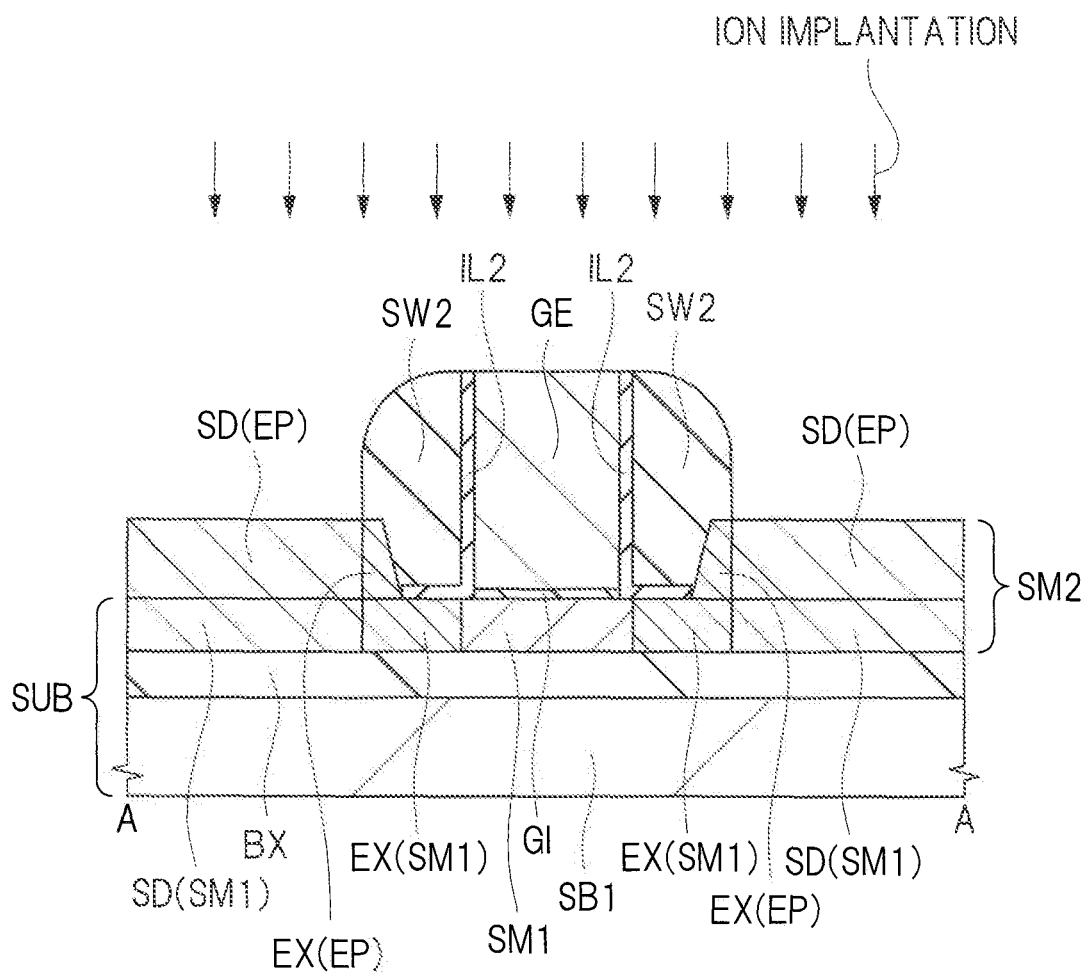
FIG. 26 is an A-A cross-sectional view in the manufacturing process of the semiconductor device continued from FIG. 24.
Figure 27:
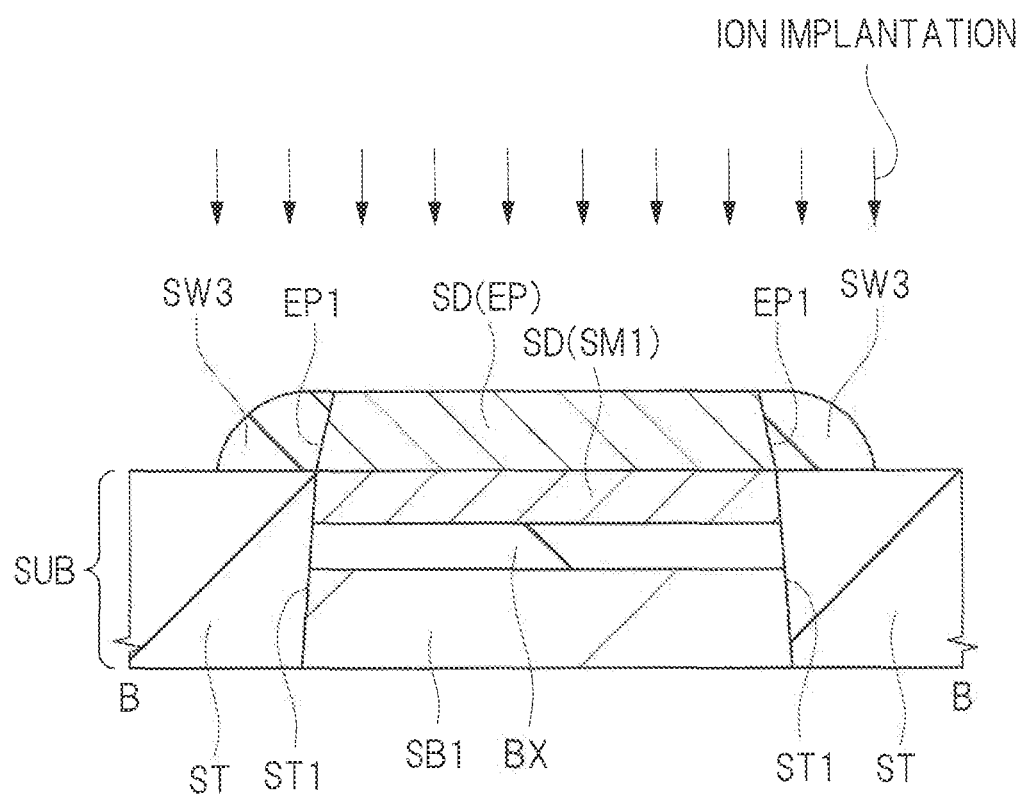
FIG. 27 is a B-B cross-sectional view in the same manufacturing process of the semiconductor device as that of FIG. 26.

Next, as shown in FIG. 26 (A-A cross-sectional view) and FIG. 27 (B-B cross-sectional view), by ion-implanting an n-type impurity such as phosphorus (P) or arsenic (As) in the regions of the semiconductor layer SM2 (that is, semiconductor layers SM1 and EP) on the both sides of the gate electrode GE and the sidewall spacer SW2, n⁺-type semiconductor regions SD are formed (step S9 in FIG. 5).

Note that, in FIGS. 26 and 27, the ion implantation is schematically indicated by arrows. Moreover, in FIGS. 26 and 27, in order to make the region where the impurity (dopant) has been implanted by the ion implantation in step S9 (that is, the $n^+$-type semiconductor region SD) easily understood, the entire region where the impurity (dopant) has been implanted by the ion implantation in step S9 (that is, the $n^+$-type semiconductor region SD) is hatched with the same pattern. Furthermore, in FIGS. 26 and 27, the entire region that remains as the $n^-$-type semiconductor region EX because no impurity (dopant) is implanted therein in the ion implantation in step S9 is hatched with another pattern (hatched with the pattern indicating the $n^-$-type semiconductor region EX). In FIGS. 28 to 37 to be described later, in order to make the drawings easy to see, the hatching indicating the $n^-$-type semiconductor region EX and the hatching indicating the $n^+$-type semiconductor region SD are omitted. Moreover, in FIGS. 28 to 37 to be described later, the entire semiconductor layer EP is hatched with dots (hatching with the same pattern as that of the semiconductor layer EP of FIGS. 16 to 19 and FIGS. 22 to 25), and the entire semiconductor layer SM1 is hatched with diagonal lines (hatching with the same pattern as that of the semiconductor layer SM1 of FIGS. 6 to 19 and FIGS. 22 to 25). Actually, however, in FIGS. 28 to 37 as well, the $n^-$-type semiconductor region EX and the $n^+$-type semiconductor region SD are formed in almost the same regions as those of FIGS. 26 and 27 or FIG. 2 mentioned above.

In the ion implantation of step S9 (ion implantation for forming the $n^+$-type semiconductor region SD), the gate electrode GE and the sidewall spacer SW2 (and the insulating film IL2 between the gate electrode GE and the sidewall spacer SW2 as well) can function as masks (ion-implantation blocking masks). For this reason, by the ion implantation in step S9, the $n^+$-type semiconductor region SD is formed in a self-aligned manner with respect to the sidewall spacer SW2. The $n^+$-type semiconductor region SD has an impurity concentration higher than that of the $n^-$-type semiconductor region EX.

In the ion implantation of step S7 (ion implantation for forming the $n^-$-type semiconductor region EX), an n-type impurity is implanted into the portions of the semiconductor layer SM2 (SM1 and EP) which are not covered with the gate electrode GE, and in the ion implantation of step S9 (ion implantation for forming the $n^+$-type semiconductor region SD), an n-type impurity is implanted into the portions of the semiconductor layer SM2 (SM1 and EP) which are not covered with the gate electrode GE and the sidewall spacer SW2.

Before forming the sidewall spacer SW2 in step S8, the ion implantation (step S7) for forming the $n^-$-type semiconductor region EX is carried out, and after forming the sidewall spacer SW2 in step S8, the ion implantation (step S9) for forming the $n^+$-type semiconductor region SD is carried out. For this reason, in a state where the process up to step S9 has been carried out, the $n^-$-type semiconductor region EX is formed in the portion of the semiconductor layer SM2 (SM1, EP) right below the sidewall spacer SW2. Therefore, the $n^-$-type semiconductor region EX is formed in the semiconductor layer SM2 so as to be adjacent to the channel formation region (a portion of the semiconductor layer SM1 positioned right below the gate electrode GE), and the $n^+$-type semiconductor region. SD is formed in the semiconductor layer SM2 so as to be spaced from the channel formation region by a distance corresponding to the $n^-$-type semiconductor region EX and be in contact with (adjacent to) the $n^-$-type semiconductor region EX.

Next, an activation annealing which is a heat treatment for activating the impurity implanted in the $n^+$-type semiconductor region SD, the $n^-$-type semiconductor region EX and others is carried out (step S10 in FIG. 5). Also, in the case where the ion implantation region is amorphized, the amorphized region can be crystallized in this activation annealing of step S10.

Next, by a salicide (Salicide: Self Aligned Silicide) technique, a metal silicide layer MS having a low resistance is formed on the surface (upper layer portion) of the $n^+$-type semiconductor region SD, that is, on the surface (upper layer portion) of the semiconductor layer EP (step S11 of FIG. 5).

Figure 28:
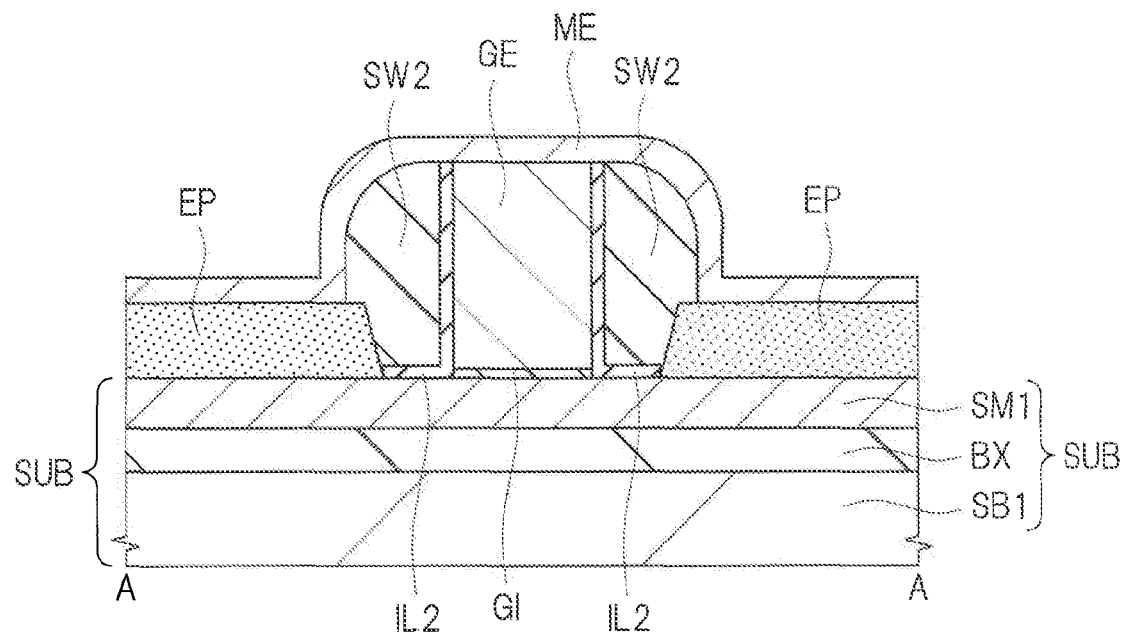
FIG. 28 is an A-A cross-sectional view in the manufacturing process of the semiconductor device continued from FIG. 26.
Figure 29:
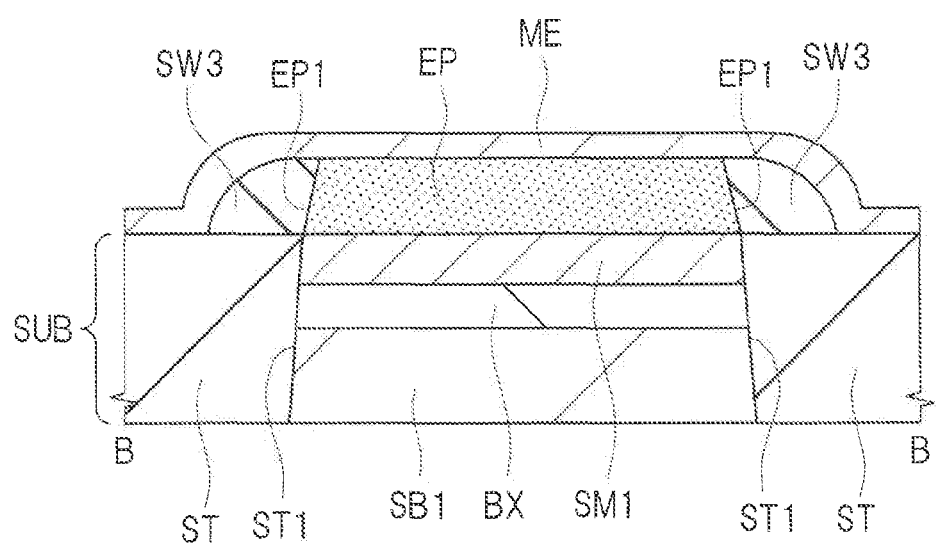
FIG. 29 is a B-B cross-sectional view in the same manufacturing process of the semiconductor device as that of FIG. 28.
Figure 30:
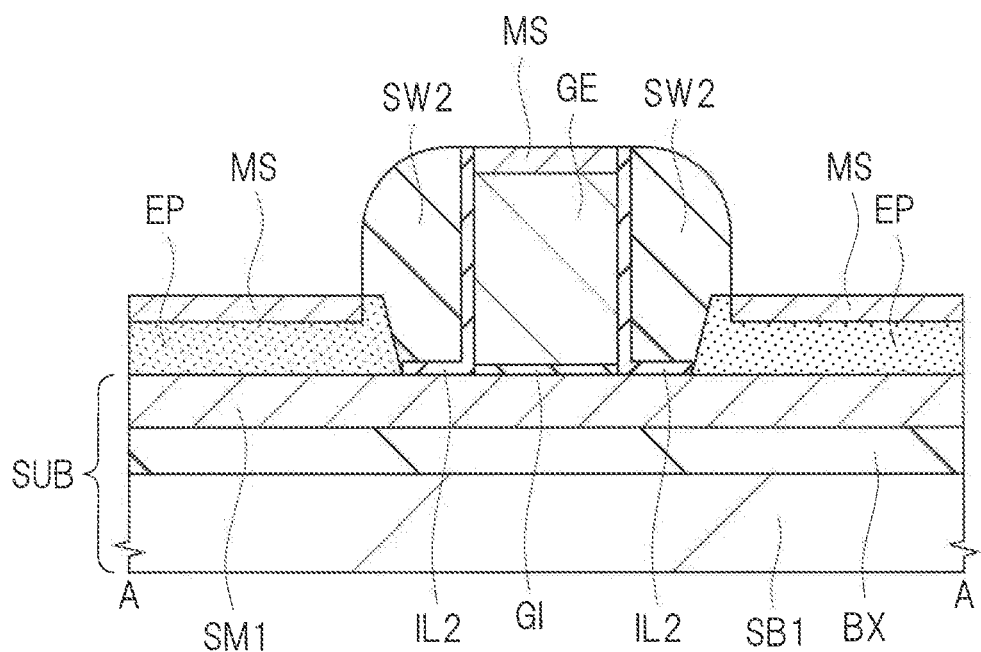
FIG. 30 is an A-A cross-sectional view in the manufacturing process of the semiconductor device continued from FIG. 28.
Figure 31:
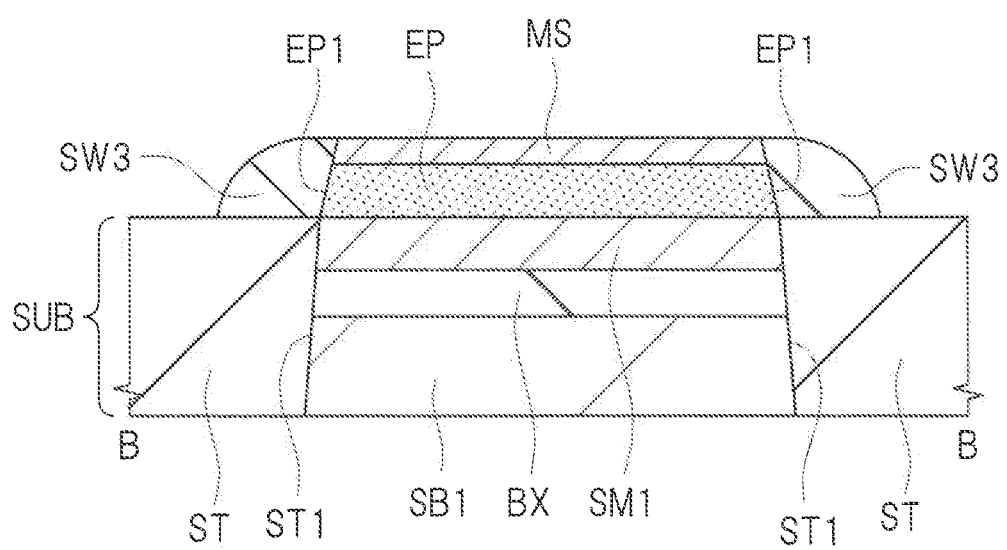
FIG. 31 is a B-B cross-sectional view in the same manufacturing process of the semiconductor device as that of FIG. 30.

The process of forming the metal silicide layer MS in step S11 is carried out in the following manner. That is, first, the surface of the $n^+$-type semiconductor region SD (more specifically, the surface of the portion of the semiconductor layer EP which is not covered with the gate electrode GE, the insulating film IL2 and the sidewall spacer SW2) is exposed. Then, as shown in FIG. 28 (A-A cross-sectional view) and FIG. 29 (B-B cross-sectional view), a metal film ME is formed on the main surface (entire surface) of the SOI substrate SUB so as to cover the gate electrode GE, the insulating film IL2, the sidewall spacers SW2 and SW3 and the $n^+$-type semiconductor region SD. The metal film ME is made of, for example, a cobalt (Co) film, a nickel (Ni) film, a nickel-platinum alloy film, or the like and can be formed by using a sputtering method or the like. Thereafter, the metal film ME and (the semiconductor layer EP constituting) the $n^+$-type semiconductor region SD are reacted with each other by a heating process. Thus, as shown in FIG. 30 (A-A cross-sectional view) and FIG. 31 (B-B cross-sectional view), the metal silicide layer MS, which is a reaction layer (reaction layer between metal and semiconductor) between the metal film ME and (the semiconductor layer EP constituting) the $n^+$-type semiconductor region SD, is formed on the surface of the $n^+$-type semiconductor region SD (that is, the surface of the semiconductor layer EP). Thereafter, the unreacted metal film ME is removed. FIG. 30 (A-A cross-sectional view) and FIG. 31 (B-B cross-sectional view) show this stage.

In the case where the semiconductor layer EP is a silicon layer and the metal film ME is a cobalt film, the metal silicide layer MS is a cobalt silicide layer, in the case where the semiconductor layer EP is a silicon layer and the metal film ME is a nickel film, the metal silicide layer MS is a nickel silicide layer, and in the case where the semiconductor layer EP is a silicon layer and the metal film ME is a nickel-platinum alloy film, the metal silicide layer MS is a nickel-platinum silicide layer. By forming the metal silicide layer MS, diffusion resistance, contact resistance and the like of the $n^+$-type semiconductor region SD can be reduced.

The metal silicide layer MS is formed on the surface (upper layer portion) of the $n^+$-type semiconductor region SD, but the metal silicide layer MS formed on the surface of the $n^+$-type semiconductor region SD is mainly formed on the semiconductor layer EP. Also, since the sidewall EP1 of the semiconductor layer EP is covered with the sidewall spacer SW3, it is possible to prevent the metal silicide layer MS from being formed on the sidewall EP1 of the semiconductor layer EP.

Moreover, in the case where the gate electrode GE is formed of a silicon film such as a polysilicon film and the above-mentioned metal film ME is formed in a state where the upper surface of the gate electrode GE is exposed (that is, state where the insulating film IL1 has been removed from the gate electrode GE), since Si constituting the gate electrode GE and the metal film ME are reacted with each other in step S11, the metal silicide layer MS is formed also on the upper portion of the gate electrode GE. Since the sidewall of the gate electrode GE is covered with the insulating film IL2 and the sidewall spacer SW2, no metal silicide layer MS is formed on the sidewall of the gate electrode GE.

In step S11, a metal compound layer, which is a compound layer (reaction layer) between metal and (an element constituting) the semiconductor layer EP, that is, the metal silicide layer MS in this case is formed on the semiconductor layer EP. In the case where the semiconductor layer EP is a silicon (Si) layer, the metal silicide layer MS is formed on the semiconductor layer EP. However, in the case where the semiconductor layer EP is an SiGe (silicon germanium) layer, a metal silicon germanide layer is formed in place of the metal silicide layer MS, and in the case where the semiconductor layer EP is a Ge (germanium) layer, a metal germanide layer is formed in place of the metal silicide layer MS.

Figure 32:
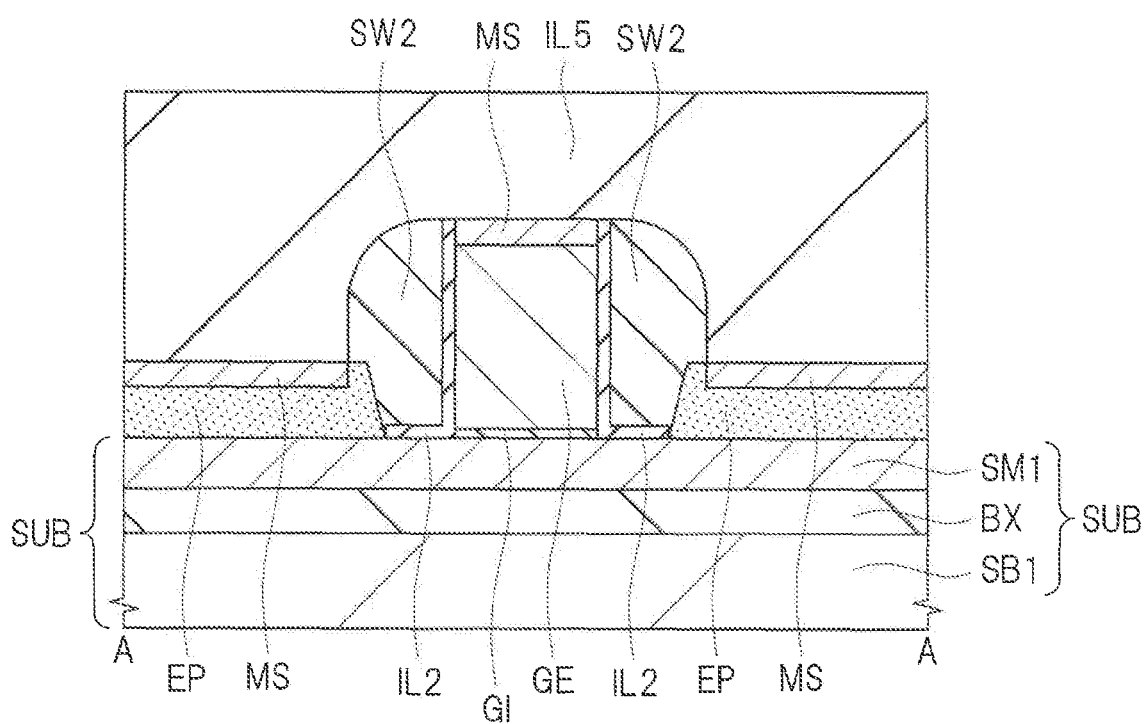
FIG. 32 is an A-A cross-sectional view in the manufacturing process of the semiconductor device continued from FIG. 30.
Figure 33:
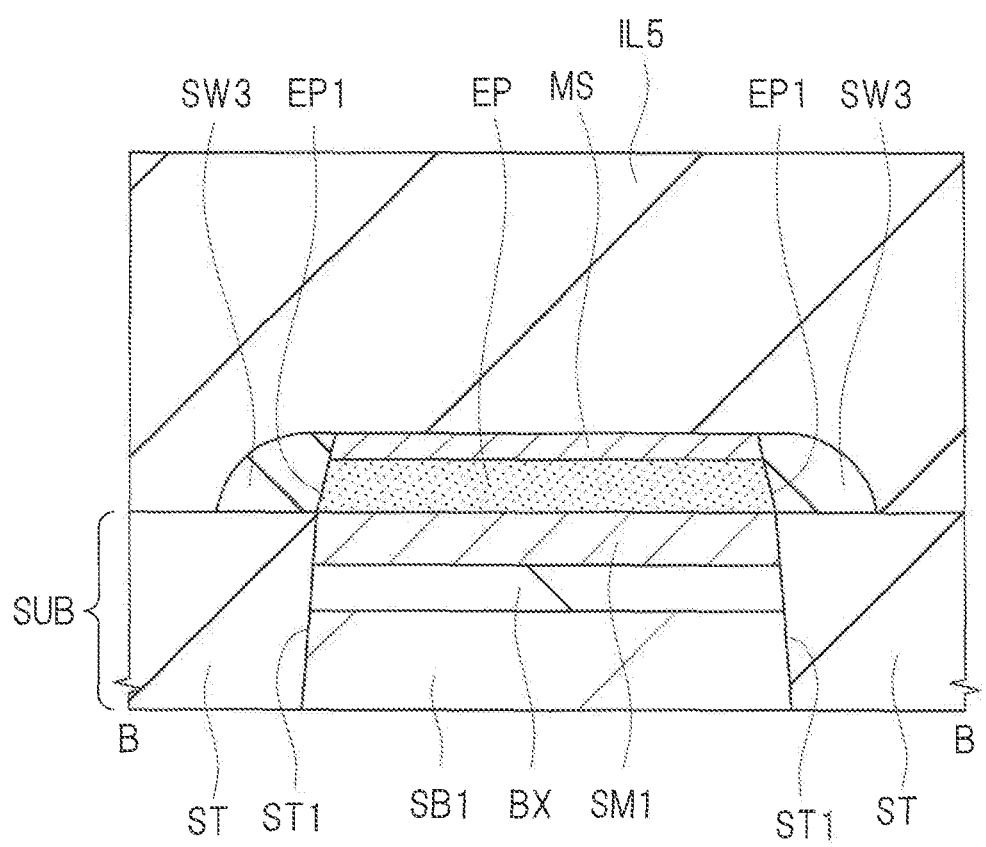
FIG. 33 is a B-B cross-sectional view in the same manufacturing process of the semiconductor device as that of FIG. 32.

Next, as shown in FIG. 32 (A-A cross-sectional view) and FIG. 33 (B-B cross-sectional view), an insulating film (interlayer insulating film) IL5 serving as an interlayer insulating film is formed on the main surface (entire main surface) of the SOI substrate SUB (step S12 of FIG. 5). More specifically, the insulating film IL5 is formed on the main surface of the SOI substrate SUB so as to cover the gate electrode GE, the semiconductor layer EP, the sidewall spacers SW2 and SW3 and the metal silicide layer MS.

The insulating film IL5 may be, for example, a stacked film made up of a silicon nitride film and a silicon oxide film (silicon oxide film thicker than the silicon nitride film) formed on the silicon nitride film or a single substance film of a silicon oxide film. As the silicon oxide film for the insulating film IL5, the film which is mainly made of silicon oxide and further contains one or more materials selected from carbon (C), fluorine (F) nitrogen (N) boron (B) and phosphorus (P) may be used.

After the formation of the insulating film IL5, if necessary, the upper surface of the insulating film IL5 may be polished by a CMP method or the like to improve the flatness of the upper surface of the insulating film IL5.

Figure 34:
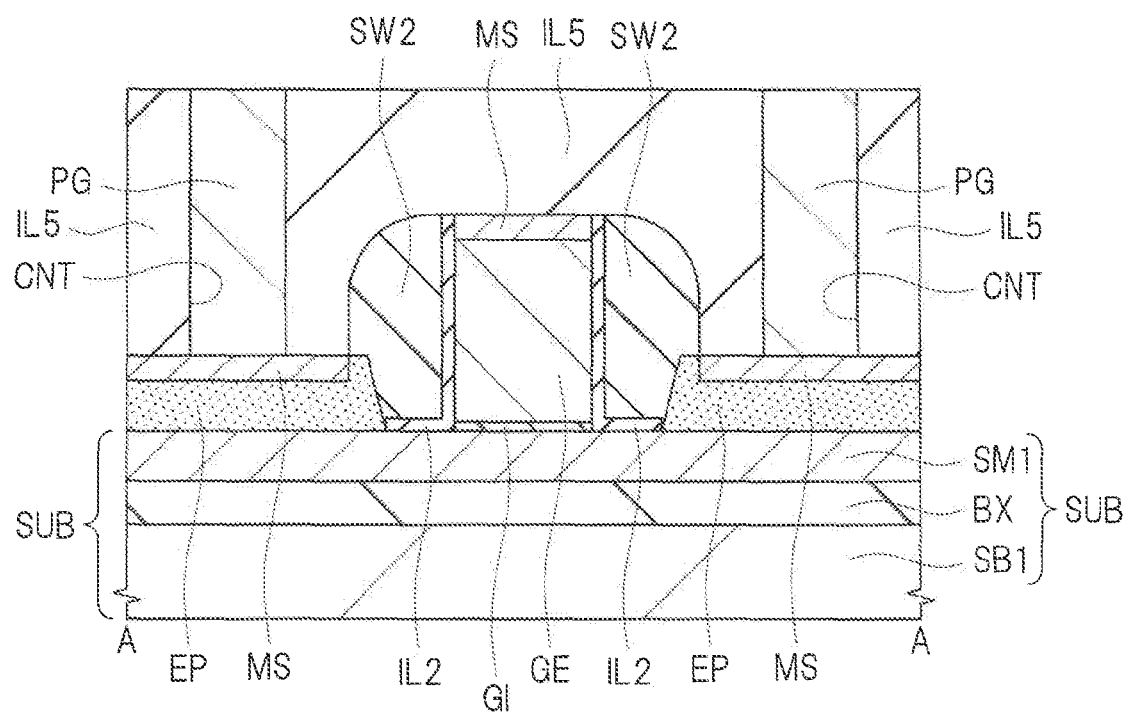
FIG. 34 is an A-A cross-sectional view in the manufacturing process of the semiconductor device continued from FIG. 32.
Figure 35:
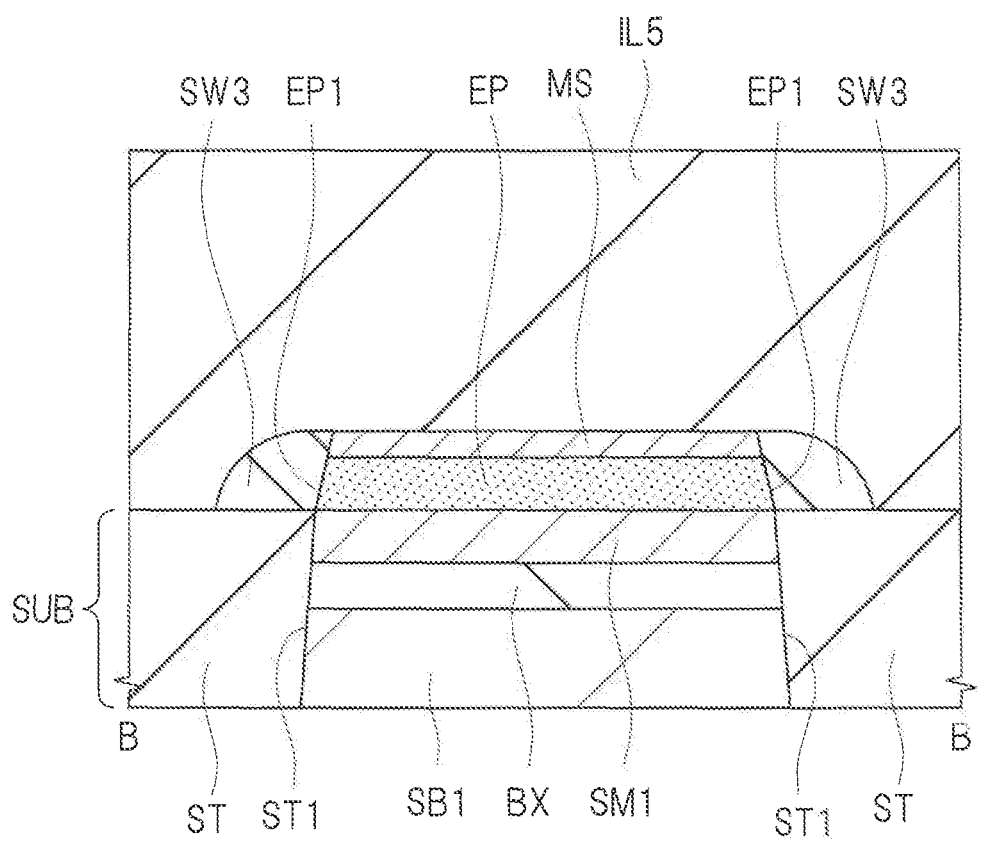
FIG. 35 is a B-B cross-sectional view in the same manufacturing process of the semiconductor device as that of FIG. 34.

Next, as shown in FIG. 34 (A-A cross-sectional view) and FIG. 35 (B-B cross-sectional view), the insulating film IL5 is dry-etched with using a photoresist pattern (not shown) formed on the insulating film IL5 as an etching mask, thereby forming contact holes (through holes, holes) CNT in the insulating film IL5. The contact hole CNT is formed so as to penetrate through the insulating film IL5.

For example, the contact hole CNT is formed on the upper portion of the $n^+$-type semiconductor region SD (that is, upper portion of the metal silicide layer MS formed on the upper layer portion of the semiconductor layer EP). At the bottom portion of the contact hole CNT formed on the upper portion of the semiconductor layer EP, the metal silicide layer MS on the semiconductor layer EP is exposed.

Next, as a conductor portion for use in connection, a conductive plug PG made of tungsten (W) or the like is formed (buried) in the contact hole CNT. The plug PG can be formed in the following manner.

In the formation of the plug PG, first, a barrier conductor film (for example, a titanium film, a titanium nitride film, or a stacked film thereof) is formed on the insulating film IL5 including the inside (on the bottom portion and sidewall) of the contact hole CNT by using a sputtering method, a plasma CVD method or the like. Then, a main conductor film made of a tungsten film or the like is formed on the barrier conductor film by using a CVD method or the like so as to bury the contact hole CNT. Thereafter, unnecessary main conductor film and barrier conductor film outside the contact hole CNT (on the insulating film IL5) are removed by a CMP method, an etching back method or the like. In this manner, the upper surface of the insulating film IL5 is exposed, and the plug PG is formed from the barrier conductor film and the main conductor film that are buried in the contact hole CNT in the insulating film IL5. Note that, for simplifying the drawings, the barrier conductor film and the main conductor film constituting the plug PG are illustrated as an integrated portion in FIG. 34 and FIG. 35.

The plug PG buried in the contact hole CNT formed on the upper portion of the $n^+$-type semiconductor region SD (that is, upper portion of the semiconductor layer EP) is in contact with the metal silicide layer MS on the surface of the $n^+$-type semiconductor region SD (semiconductor layer EP) at its bottom portion, and is electrically connected thereto. Therefore, a desired potential (source potential or drain potential) can be supplied to the metal silicide layer MS on the surface of the $n^+$-type semiconductor region SD (semiconductor layer EP) (therefore, to the $n^+$-type semiconductor region SD below the metal silicide layer MS and the $n^-$-type semiconductor region EX electrically connected thereto) through the plug PG from the wiring M1 to be descried later.

Furthermore, although not shown, in the case where the contact hole CNT and the plug PG buried therein are formed also on the upper portion of the gate electrode GE, the plug PG is in contact with the gate electrode GE (with the metal silicide layer MS when the metal silicide layer MS is formed on the gate electrode GE) at the bottom portion of the plug PG, and is electrically connected thereto.

Figure 36:
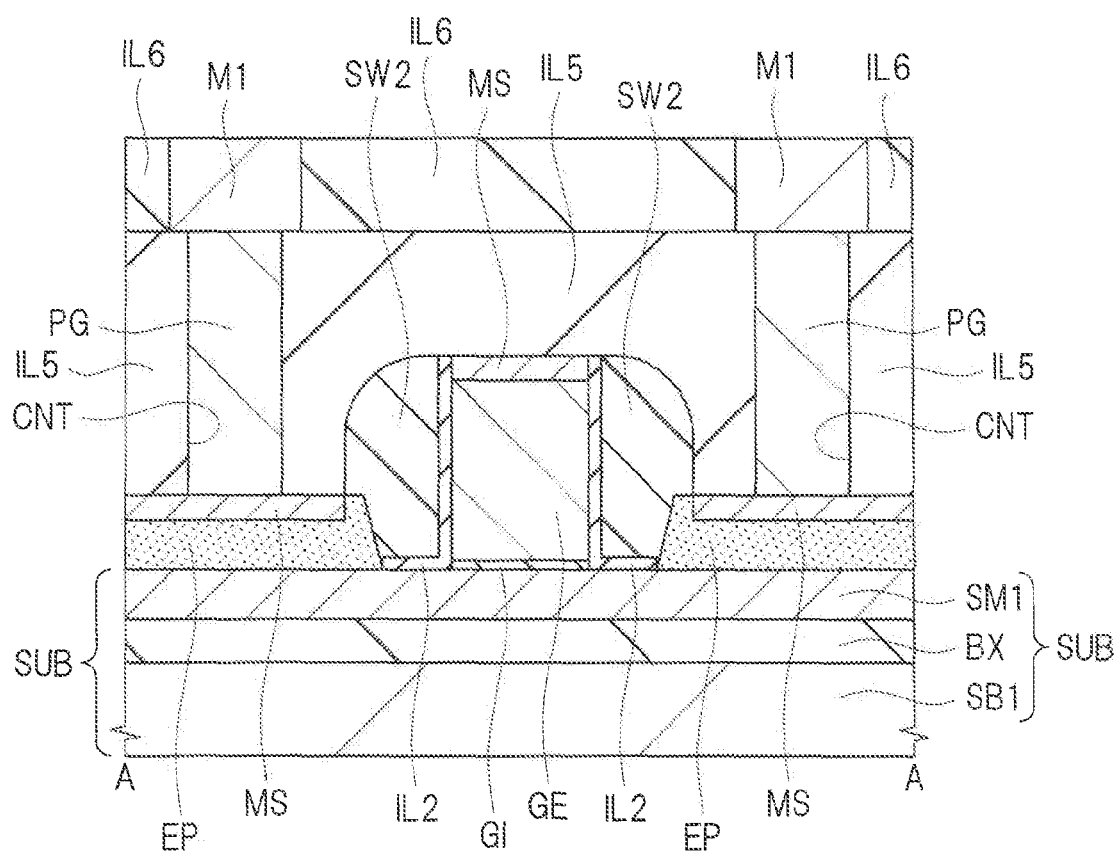
FIG. 36 is an A-A cross-sectional view in the manufacturing process of the semiconductor device continued from FIG. 34.
Figure 37:
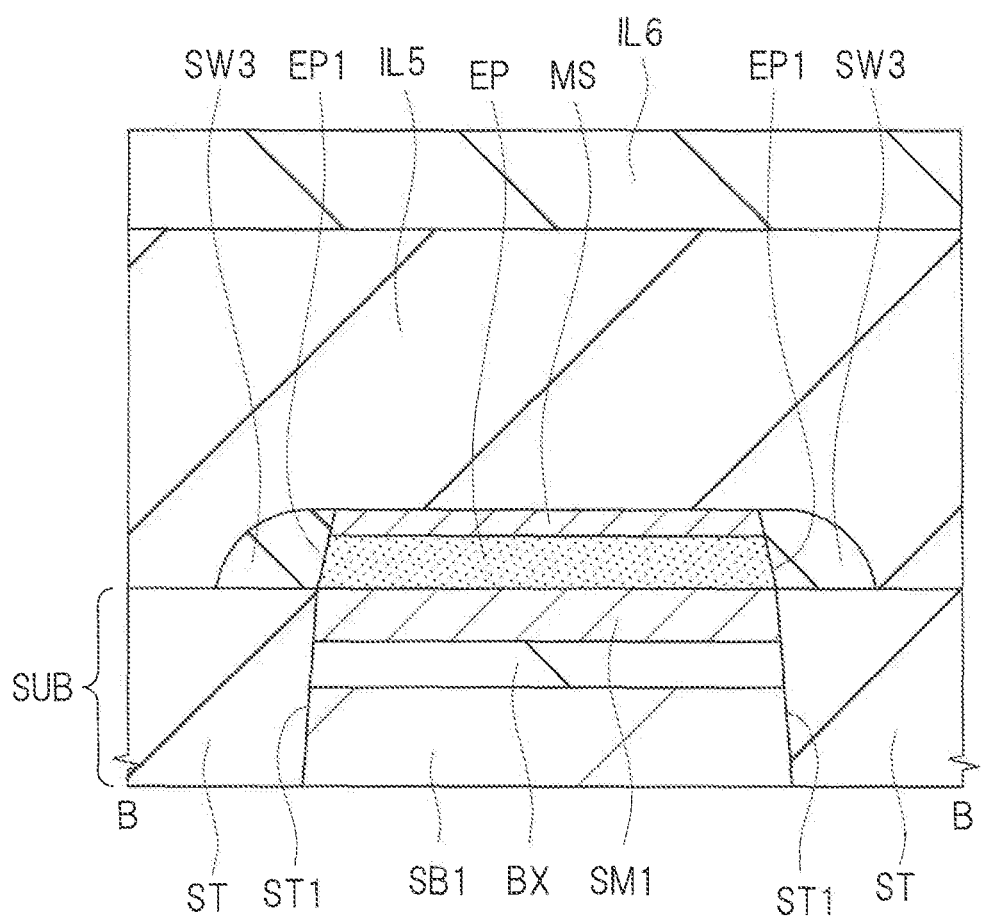
FIG. 37 is a B-B cross-sectional view in the same manufacturing process of the semiconductor device as that of FIG. 36.

Next, as shown in FIG. 36 (A-A cross-sectional view) and FIG. 37 (B-B cross-sectional view), an insulating film IL6 for wiring formation is formed on the insulating film IL5 in which the plug PG has been buried. The insulating film IL6 may be a single substance film (single substance insulating film) or a stacked film (stacked insulating film).

Next, a wiring of the first layer is formed by a single damascene method. First, after forming a wiring trench (trench for burying a wiring M1) in a predetermined region of the insulating film IL6 by dry etching with using a photoresist pattern (not shown) as a mask, a barrier conductor film (barrier metal film) is formed on the main surface of the SOI substrate SUB (that is, on the insulating film IL6 including the bottom portion and the sidewall of the wiring trench). As the barrier conductor film, for example, a titanium nitride film, a tantalum film, a tantalum nitride film or the like can be used. Subsequently, a copper seed layer is formed on the barrier conductor film by using a CVD method, a sputtering method or the like, and a copper plated film (main conductor film) is further formed on the seed layer by using an electrolytic plating method or the like. The inside of the wiring trench is buried by the copper plated film. Then, the copper plated film, the seed layer and the barrier metal film in the regions other than the wiring trench are removed by a CMP method, thereby forming the wiring M1 of the first layer using copper as its main conductor material in the wiring trench. Note that, for simplifying the drawing, the copper plated film, the seed layer and the barrier metal layer constituting the wiring M1 are illustrated as an integrated portion in FIG. 36. The wiring M1 is connected to the plug PG, and further electrically connected to the $n^+$-type semiconductor region SD or the like via the plug PG. Thus, a predetermined voltage (source voltage or drain voltage) can be applied to the $n^+$-type semiconductor region SD from the wiring M1 via the plug PG and the metal silicide layer MS (the metal silicide layer MS formed on the $n^+$-type semiconductor region SD and brought in contact with the plug PG).

Thereafter, wirings of the second and subsequent layers are formed by a dual damascene method, but illustrations and descriptions thereof will be omitted here. Also, the wiring M1 and wirings of the second and subsequent layers are not limited to the damascene wirings, and may be formed by patterning a conductor film for the wiring and a tungsten wiring, an aluminum wiring or the like can be used.

Moreover, in the present embodiment, the case in which an n-channel type MISFET is formed as the MISFET has been described. However, it is also possible to form a p-channel type MISFET by reversing the conductivity type. Furthermore, both of the n-channel type MISFET and the p-channel type MISFET may be formed on the same SOI substrate SUB.

<Main Characteristics of Present Embodiment>

The semiconductor device of the present embodiment uses a substrate (SOI substrate SUB) having the substrate SB1 serving as a support substrate, the insulating layer BX on the substrate SB1 and the semiconductor layer SM1 on the insulating layer BX, and has the gate electrode GE formed on the semiconductor layer SM1 via the gate insulating film GI. Also, the semiconductor device of the present embodiment is further provided with the sidewall spacer (sidewall insulating film) SW2 formed on the sidewall of the gate electrode GE, the semiconductor layer for source/drain (epitaxial semiconductor layer) EP formed on the semiconductor layer SM1 and the sidewall spacer (sidewall insulating film) SW3 formed on the sidewall (EP1) of the semiconductor layer EP.

Figure 38:
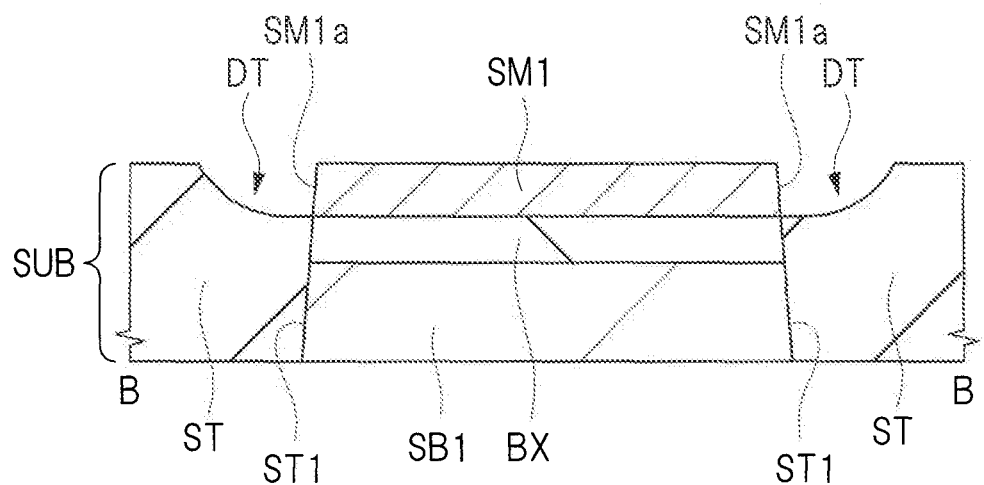
FIG. 38 is a cross-sectional view showing the principal part in the manufacturing process of a semiconductor device of a first examination example.

Since the sidewall spacer (sidewall insulating film) SW3 is formed on the sidewall (EP1) of the semiconductor layer EP, it is possible to prevent the failure caused by the exposure of the sidewall (EP1) of the semiconductor layer EP. For example, when forming the contact hole CNT as shown in FIG. 34, the position of the contact hole CNT sometimes extends across the two portions of the semiconductor layer EP and the element isolation region ST due to the position shift of mask or the like. At that time, there is fear that the element isolation region ST is removed by the etching for forming the contact hole CNT and the etching reaches the substrate SB1. This causes a more serious failure when the divot DT as shown in FIG. 38 to be described later is formed. Therefore, by forming the sidewall spacer (sidewall insulating film) SW3 on the sidewall (EP1) of the semiconductor layer EP in advance as described in the present embodiment, it is possible to increase an etching margin by the portion corresponding to the film thickness of the sidewall spacer SW3. Accordingly, the performance of the semiconductor device can be improved.

Moreover, in the present embodiment, preferably, a compound layer (metal silicide layer MS in this case) between metal and an element constituting the semiconductor layer EP is formed on the upper portion of the semiconductor layer EP serving as an epitaxial semiconductor layer for source/drain.

By forming the sidewall spacer (sidewall insulating film) SW3 on the sidewall (EP1) of the semiconductor layer EP and forming the compound layer (metal silicide layer MS in this case) between metal and an element constituting the semiconductor layer EP on the upper portion of the semiconductor layer EP, it is possible to suppress or prevent the metal silicide layer MS from being formed on the sidewall of the semiconductor layer EP covered with the sidewall spacer SW3. For this reason, it is possible to suppress or prevent the failures due to an abnormal growth toward the insulating layer BX side of the metal silicide layer MS formed on the sidewall of the semiconductor layer EP (for example, leakage, short-circuit or the like between the semiconductor layer SM1 and the substrate SB1 through the abnormally grown metal silicide layer MS).

Moreover, in the present embodiment, preferably, the element isolation region ST which is formed in the SOI substrate SUB and penetrates through the semiconductor layer SM1 and the insulating layer BX and whose bottom portion reaches the substrate SB1 serving as the support substrate is provided, and the sidewall spacer SW3 is formed on the sidewall EP1 of the semiconductor layer EP and is positioned on the element isolation region ST.

Since the sidewall spacer SW3 is formed on the sidewall (EP1) of the semiconductor layer EP and is positioned on the element isolation region ST, the sidewall (EP1) of the semiconductor layer EP adjacent to the element isolation region ST can be covered with the sidewall spacer SW3. For this reason, it is possible to suppress or prevent the failures due to the abnormal growth toward the insulating layer BX side of the metal silicide layer MS formed on the sidewall (EP1) of the semiconductor layer EP at the position adjacent to the element isolation region ST (for example, leakage, short-circuit or the like between the semiconductor layer SM1 and the substrate SB1 through the abnormally grown metal silicide layer MS). Moreover, even when a divot (concave portion, recessed portion or the like) occurs in the element isolation region ST, since the sidewall spacer SW3 is present, it is possible to suppress or prevent the failures caused by the divot. For example, even when the side surface of the semiconductor layer SM1 is exposed at a position adjacent to the divot of the element isolation region ST, the exposed side surface can be covered with the sidewall spacer SW3. Therefore, it is possible to suppress or prevent the metal silicide layer MS from being formed on the side surface of the semiconductor layer SM1 at the position adjacent to the divot of the element isolation region ST, so that it becomes possible to suppress or prevent the occurrence of leakage, short-circuit or the like between the semiconductor layer SM1 and the substrate SB1 due to the abnormal growth of the metal silicide layer MS. Therefore, the performance of the semiconductor device can be improved. Moreover, the reliability of the semiconductor device can be improved.

Also, in the present embodiment, preferably, the sidewall spacer SW3 is formed on the sidewall (EP1) of the semiconductor layer EP, is positioned on the element isolation region ST, and covers the side surface (SM1a) of the semiconductor layer SM1.

When a divot (concave portion, recessed portion) or the like occurs in the element isolation region ST, the side surface (SM1a) of the semiconductor layer SM1 is exposed at a position adjacent to the divot. However, since the sidewall spacer SW3 formed on the sidewall (EP1) of the semiconductor layer EP is positioned on the element isolation region ST and covers also the side surface (SM1a) of the semiconductor layer SM1, it is possible to suppress or prevent the metal silicide layer MS from being formed on the sidewall (EP1) of the semiconductor layer EP and the side surface (SM1a) of the semiconductor layer SM1 at the position adjacent to the element isolation region ST (position adjacent to the divot). For this reason, it is possible to suppress or prevent the occurrence of the failures due to the abnormal growth toward the insulating layer BX side of the metal silicide layer MS formed on the sidewall (EP1) of the semiconductor layer EP and the side surface (SM1a) of the semiconductor layer SM1 (for example, leakage or short-circuit or the like between the semiconductor layer SM1 and the substrate SB1 through the abnormally grown metal silicide layer MS). Therefore, the performance of the semiconductor device can be improved. Moreover, the reliability of the semiconductor device can be improved.

Also, in the present embodiment, preferably, one portion of the sidewall spacer SW2 is positioned on the semiconductor layer EP.

Since one portion of the sidewall spacer SW2 is positioned on the semiconductor layer EP, it is possible to prevent the metal silicide layer MS from being easily formed on one portion of the surface of the semiconductor layer EP covered with the sidewall spacer SW2. Therefore, it is possible to suppress or prevent the metal silicide layer MS formed on the surface of the semiconductor layer EP from being grown into the semiconductor layer SM1 to reduce the effective thickness of the semiconductor region in the semiconductor layer SM1. Therefore, the performance of the semiconductor device can be improved. Moreover, the reliability of the semiconductor device can be improved.

Hereinafter, characteristics of the present embodiment will be described more specifically with reference to the examination examples studied by the inventors of the present invention.

<Examination Example and Present Embodiment>

In the case where a semiconductor device is manufactured by using an SOI substrate, a semiconductor layer for source/drain is epitaxially grown on the semiconductor layer of the SOI substrate. In this manner, for example, it is possible to reduce the resistance while making the depth of the source/drain diffusion layer shallower, and it is also possible to ensure the thickness of the semiconductor layer suitable for forming a metal silicide layer in a salicide process. The examination has been conducted for the semiconductor device like this.

Figure 43:
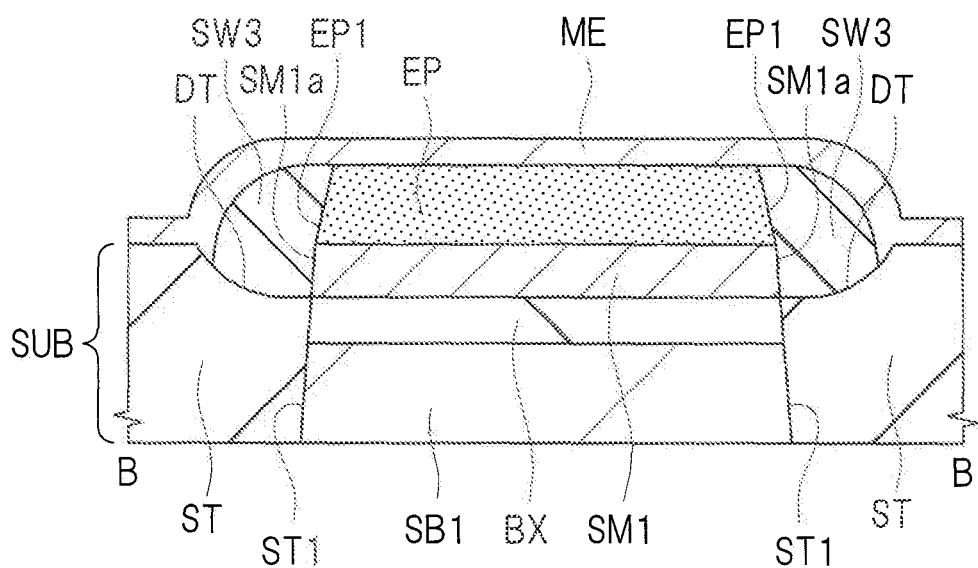
FIG. 43 is a cross-sectional view showing the principal part of the semiconductor device according to the embodiment.
Figure 44:
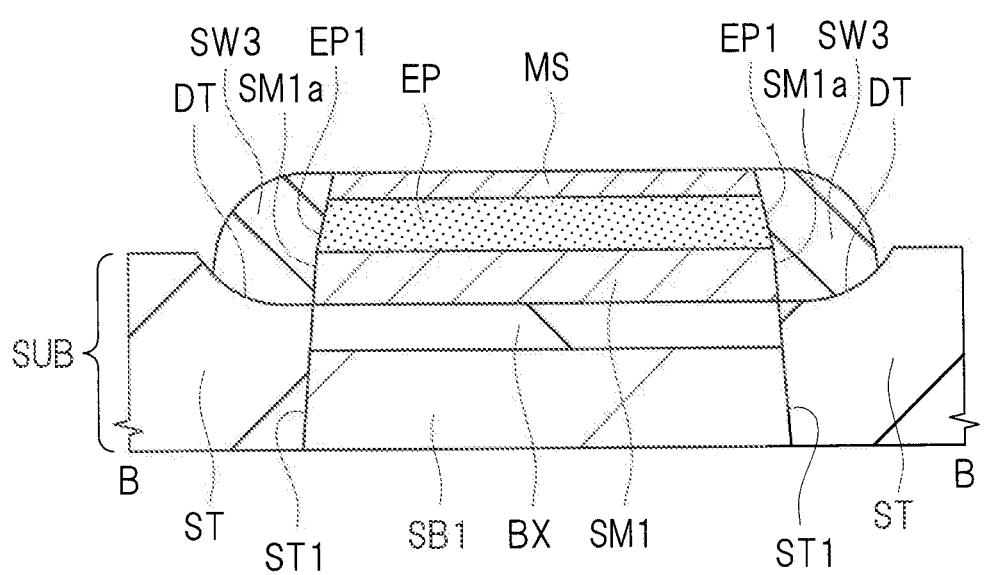
FIG. 44 is a plan view showing the principal part of the semiconductor device according to the embodiment.

FIGS. 38 to 41 are cross-sectional views each showing the principal part in a manufacturing process of a semiconductor device according to a first examination example studied by the inventors of the present invention. FIGS. 42 to 44 are cross-sectional views each showing the principal part in the manufacturing process of the semiconductor device of the present embodiment. Note that FIG. 42 corresponds to a B-B cross-sectional view in a stage where the sidewall spacers SW2 and SW3 have been formed in step S8 mentioned above (that is, process stage corresponding to the FIG. 25 mentioned above). Moreover, FIG. 43 corresponds to a B-B cross-sectional view in a stage where the metal film ME has been formed in step S11 mentioned above (that is, process stage corresponding to FIG. 29 mentioned above). Furthermore, FIG. 44 corresponds to a B-B cross-sectional view in a stage where the metal silicide layer MS has been formed in step S11 mentioned above (that is, process stage corresponding to FIG. 31 mentioned above).

In the case where a semiconductor element such as a MISFET is formed on the SOI substrate SUB in which the element isolation region ST has been formed, as shown in FIG. 38, a divot (concave portion or recessed portion) DT forming a recessed portion sometimes occurs in the element isolation region ST due to various processes (for example, chemicals or the like used in a cleaning process, an etching process or the like). When the divot DT occurs in a region of the element isolation region ST adjacent to the semiconductor layer SM1 (that is, outer peripheral portion of the upper surface of the element isolation region ST), the side surface SM1a of the semiconductor layer SM1 adjacent to the divot DT is exposed. When the semiconductor layer EP is formed on the semiconductor layer SM1 as described above, in the stacked structure of the semiconductor layer SM1 and the semiconductor layer EP formed thereon, the sidewall EP1 of the semiconductor layer EP and the side surface (sidewall) SM1a of the semiconductor layer SM1 are exposed in a region adjacent to the divot DT in the element isolation region ST as shown in FIG. 39. The phenomenon in which the sidewall EP1 of the semiconductor layer EP and the side surface SM1a of the semiconductor layer SM1 are exposed in the region adjacent to the divot DT in the element isolation region ST occurs not only when the divot DT is formed in the element isolation region ST prior to the formation of the semiconductor layer EP, but also when the divot DT is formed in the element isolation region ST after the formation of the semiconductor layer EP.

Figure 40:
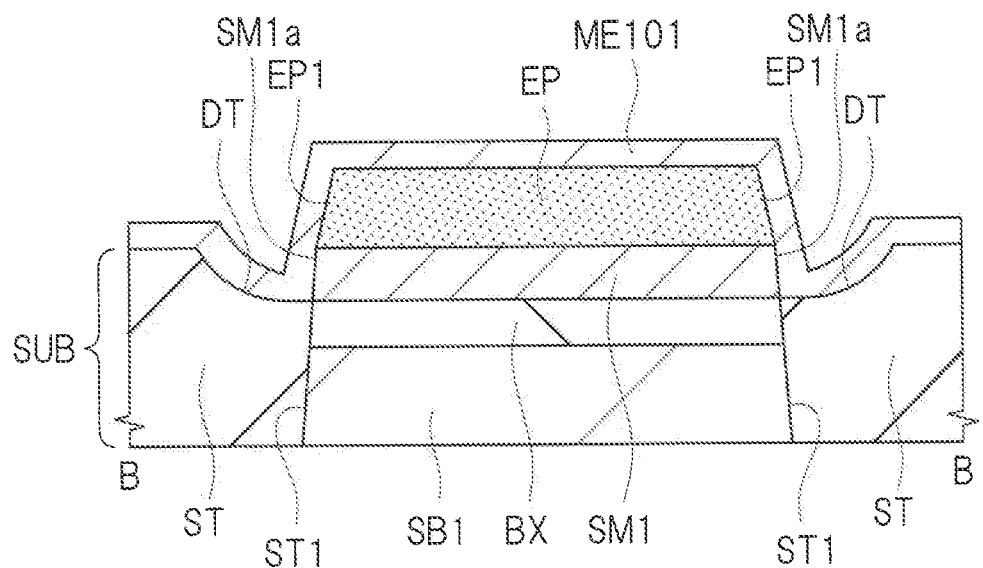
FIG. 40 is a cross-sectional view showing the principal part in the manufacturing process of the semiconductor device of the first examination example continued from FIG. 39.
Figure 41:
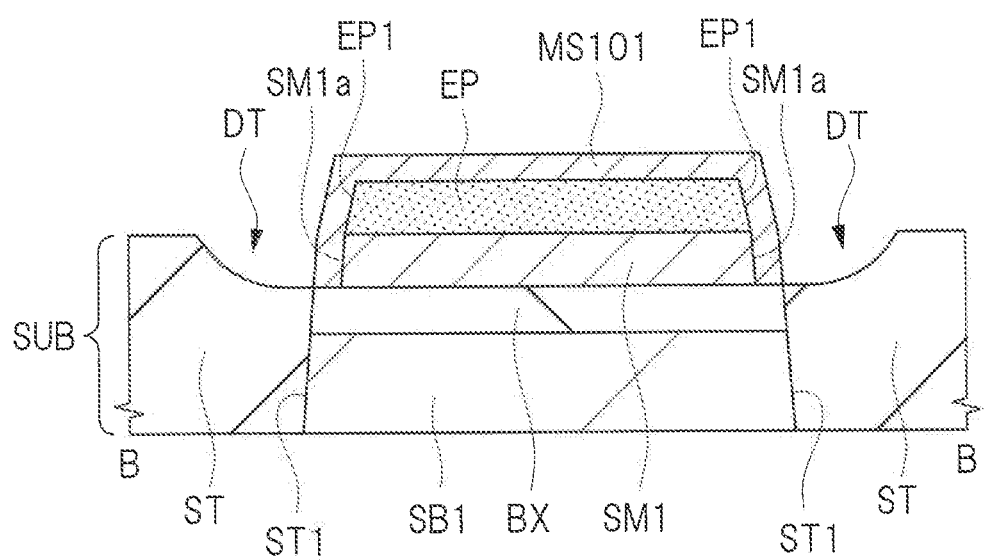
FIG. 41 is a cross-sectional view showing the principal part in the manufacturing process of the semiconductor device of the first examination example continued from FIG. 40.

FIGS. 40 and 41 show the case in which the divot DT is formed in the element isolation region ST and the salicide process is carried out in the state where the sidewall EP1 of the semiconductor layer EP and the side surface SM1a of the semiconductor layer SM1 are exposed in the region adjacent to the divot DT. In this case, as shown in FIG. 40, when a metal film ME101 corresponding to the metal film ME is formed on the main surface of the SOI substrate SUB, the metal film ME101 is brought in contact with the sidewall EP1 of the semiconductor film EP and the side surface SM1a of the semiconductor layer SM1 in the region adjacent to the divot DT.

FIG. 41 shows the state in which the metal film ME101 and the semiconductor layer EP are then reacted by carrying out a heating process to form a metal silicide layer MS101 corresponding to the metal silicide layer MS (in this case, an unreacted portion of the metal film ME101 after the heating process is removed). Since the side surface SM1a of the semiconductor layer SM1 is also in contact with the metal film ME101, as shown in FIG. 41, the metal film ME101 and the semiconductor layer SM1 are reacted to form the metal silicide layer MS101 not only on the upper surface of the semiconductor layer EP, but also on the sidewall EP1 of the semiconductor layer EP and on the side surface SM1a of the semiconductor layer SM1.

In the case where a semiconductor device is manufactured by using the SOI substrate SUB on which the semiconductor layer SM1 is formed on the substrate SB1 serving as a support substrate via the insulating layer BX, there is fear that a short-circuit or a leakage (leakage current) occurs between the substrate SB1 and the semiconductor layer SM1 due to the divot DT in the element isolation region ST formed in the SOI substrate SUB. This phenomenon tends to occur more frequently as the thickness of the insulating layer BX becomes smaller (becomes in particular conspicuous when the thickness of the insulating layer BX is, for example, about 10 nm or less). When the divot DT occurs in the element isolation region ST, the side surface SM1a of the semiconductor layer SM1 is exposed in the region adjacent to the divot DT as shown in FIG. 38 and FIG. 39, and the metal silicide layer MS101 is formed also on the side surface SM1a of the semiconductor layer SM1 in the salicide process as shown in FIGS. 40 and 41, and this causes the occurrence of a short-circuit or a leakage between the substrate SB1 and the semiconductor layer SM1. For example, the metal silicide layer MS101 formed on the side surface SM1a of the semiconductor layer SM1 abnormally grows toward the insulating layer BX side, and a short-circuit or a leakage occurs between the substrate SB1 and the semiconductor layer SM1 through this metal silicide layer MS101. This leads to the degradation in the performance of the semiconductor device and also causes the degradation in the reliability of the semiconductor device.

In contrast, in the present embodiment, since the sidewall spacer SW3 is formed on the sidewall EP1 of the semiconductor layer EP. Therefore, even in the case where the sidewall EP1 of the semiconductor layer EP and the side surface SM1a of the semiconductor layer SM1 are exposed in the region adjacent to the divot DT in the element isolation region ST as shown in FIG. 39, since the sidewall spacer SW3 is then formed on the sidewall EP1 of the semiconductor layer EP as shown in FIG. 42, the sidewall EP1 of the semiconductor layer EP and the side surface SM1a of the semiconductor layer SM1 are not exposed.

More specifically, in the present embodiment, the sidewall spacer SW3 is formed on the sidewall EP1 of the semiconductor layer EP, and the sidewall spacer SW3 is formed on the sidewall EP1 of the semiconductor layer EP and is positioned on the element isolation region ST. When the divot DT occurs in the element isolation region ST as shown in FIG. 39, the side surface SM1a of the semiconductor layer SM1 is also exposed in the region adjacent to the divot DT. Therefore, when the sidewall spacer SW3 is formed in this state, the sidewall spacer SW3 is formed on the sidewall EP1 of the semiconductor layer EP, is positioned on the element isolation region ST, and covers the side surface SM1a of the semiconductor layer SM1 as shown in FIG. 42.

For this reason, in the present embodiment, when the sidewall spacer SW3 is formed and the metal film ME is then formed in the salicide process as shown in FIG. 43, it is possible to prevent the metal film ME from being in contact with the sidewall EP1 of the semiconductor layer EP and the side surface SM1a of the semiconductor layer SM1. In particular, the contact of the metal film ME with the side surface SM1a of the semiconductor layer SM1 can be prevented. More specifically, since the sidewall spacer SW3 formed on the sidewall EP1 of the semiconductor layer EP covers also the side surface SM1a of the semiconductor layer SM1 in the region adjacent to the divot DT, the sidewall spacer SW3 is interposed between the side surface SM1a of the semiconductor layer SM1 and the metal film ME, so that it is possible to prevent the side surface SM1a of the semiconductor layer SM1 from being in contact with the metal film ME.

Thus, in the present embodiment, when the metal silicide layer MS is formed by the reaction between the metal film ME and the semiconductor layer EP by a heating process, as shown in FIG. 44, the metal silicide layer MS is formed on the upper surface of the semiconductor layer EP, but the metal silicide layer MS is prevented from being formed on the sidewall EP1 of the semiconductor layer EP and the side surface SM1a of the semiconductor layer SM1 because they are not in contact with the metal film ME. In particular, it is possible to prevent the metal silicide layer MS from being formed on the side surface SM1a of the semiconductor layer SM1. Note that FIG. 44 shows a stage in which an unreacted portion of the metal film ME has been removed after the heating process.

Therefore, in the present embodiment, even when the divot DT occurs in the element isolation region ST formed in the SOI substrate SUB, it is possible to suppress or prevent a short-circuit or a leakage (leakage current) from occurring between the substrate SB1 and the semiconductor layer SM1 due to the divot DT. In other words, even when the side surface SM1a of the semiconductor layer SM1 is exposed in the region adjacent to the divot DT due to the occurrence of the divot DT in the element isolation region ST as shown in FIG. 39, the sidewall spacer SW3 formed on the sidewall EP1 of the semiconductor layer E1 covers also the side surface SM1a of the semiconductor layer SM1 as shown in FIG. 42. For this reason, as shown in FIG. 43 and FIG. 44, even when the metal silicide layer MS is formed in the salicide process, it is possible to prevent the metal silicide layer MS from being formed on the side surface SM1a of the semiconductor layer SM1, and therefore, it is possible to suppress or prevent a short-circuit or a leakage from occurring between the substrate SB1 and the semiconductor layer SM1 through the metal silicide layer MS. Moreover, even when an abnormal growth occurs in the metal silicide layer MS since no metal silicide layer MS is formed on the side surface SM1a of the semiconductor layer SM1, the phenomenon in which the metal silicide layer MS formed on the side surface SM1a of the semiconductor layer SM1 abnormally grows toward the insulating layer BX side does not occur, and it is possible to prevent a short-circuit or a leakage from occurring between the substrate SB1 and the semiconductor layer SM1 through the abnormally grown metal silicide layer MS. Therefore, the performance of the semiconductor device can be improved. Moreover, the reliability of the semiconductor device can be improved.

Furthermore, in the present embodiment, even in the case where the side surface SM1a of the semiconductor layer SM1 is exposed due to any reason other than the divot DT in the element isolation region ST, the corresponding exposed side surface SM1a of the semiconductor layer SM1 can be covered with the sidewall spacer SW3. Thus, it is possible to prevent the metal silicide layer MS from being formed on the side surface SM1a of the semiconductor layer SM1, and consequently the performance of the semiconductor device can be improved. Moreover, the reliability of the semiconductor device can be improved.

Figure 45:
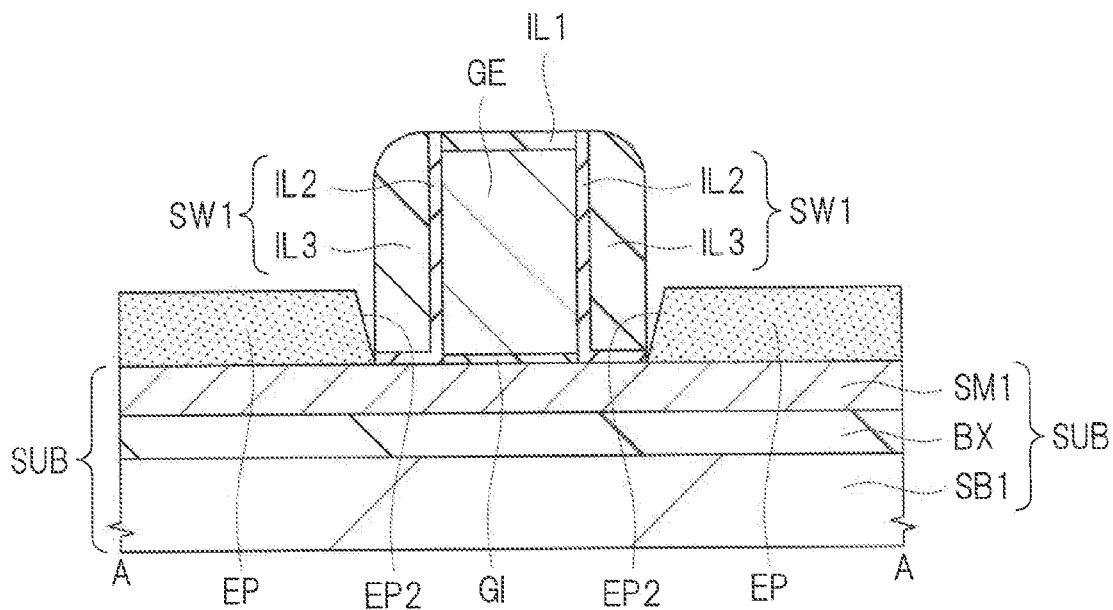
FIG. 45 is a cross-sectional view showing the principal part in the manufacturing process of a semiconductor device of a second examination example.
Figure 46:
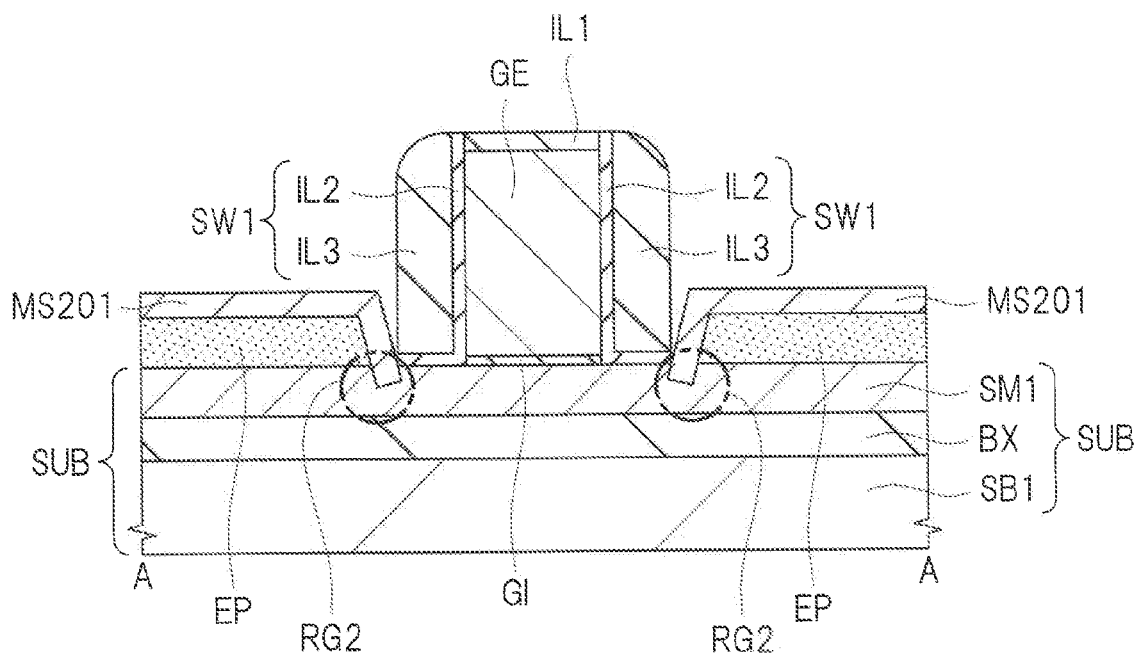
FIG. 46 is a cross-sectional view showing the principal part in the manufacturing process of the semiconductor device continued from FIG. 45.

FIG. 45 and FIG. 46 are cross-sectional views, each showing the principal part in a manufacturing process of a semiconductor device according to a second examination example studied by the inventors of the present invention.

In the second examination example, as shown in FIG. 45, the semiconductor layer EP for source/drain is formed in the state where the sidewall spacer SW1 is formed on the sidewall of the gate electrode GE. Thereafter, in the second examination example, unlike the present embodiment, the salicide process is carried out without removing the sidewall spacer SW1 and without forming the sidewall spacer SW2 as shown in FIG. 46, thereby forming a metal silicide layer MS201 (corresponding to the metal silicide layer MS mentioned above) on the upper portion of the semiconductor layer EP.

For this reason, in the second examination example of FIG. 45 and FIG. 46, since the sidewall spacer SW1 formed on the sidewall of the gate electrode GE is not raised over the semiconductor EP and the metal silicide layer MS201 is formed in this state, the metal silicide layer MS is likely to be formed not only on the upper surface of the semiconductor layer EP, but also on a side surface (sidewall) EP2 of the semiconductor layer EP on the gate electrode GE side. In this case, the side surface EP2 of the semiconductor layer EP corresponds to the side surface (sidewall) on the side opposed to the gate electrode GE (that is, on the side opposed to the sidewall spacer SW1 in a stage where the semiconductor layer EP has been grown).

When the metal silicide layer MS201 is formed on the side surface EP2 of the semiconductor layer EP, there is fear that the metal silicide layer MS201 formed on the side surface EP2 of the semiconductor layer EP is abnormally grown toward the semiconductor layer SM1 side or the like and a region in which the effective thickness of the semiconductor region of the semiconductor layer SM1 is reduced is provided. For example, in a region RG2 shown in FIG. 46, since the metal silicide layer MS201 formed on the side surface EP2 of the semiconductor layer EP grows into the semiconductor layer SM1, the effective thickness of the semiconductor layer SM1 is reduced. Since this narrows the current path and consequently increases the resistance component (parasitic resistance) there is fear that the performance of the semiconductor device is deteriorated. Therefore, in order to further improve the performance of the semiconductor device, it is desired to suppress or prevent the metal silicide layer MS201 from being formed on the side surface EP2 of the semiconductor layer EP.

In contrast, in the present embodiment, one portion of the sidewall spacer SW2 is positioned on (raised over) the semiconductor layer EP. When forming the metal silicide layer MS in the salicide process, a portion of the surface of the semiconductor layer EP that is exposed without being covered with the sidewall spacer SW2 is brought in contact with the metal film ME, thereby forming the metal silicide layer MS. On the other hand, another portion of the surface of the semiconductor layer EP that is covered with the sidewall spacer SW2 is not in contact with the metal film ME, and the metal silicide layer MS is not likely to be formed thereon. For this reason, when one portion of the sidewall spacer SW2 is raised over the semiconductor layer EP like the case of the present embodiment, the metal silicide layer MS is less likely to be formed on the portion of the surface of the semiconductor layer EP covered with the sidewall spacer SW2, so that the metal silicide layer MS is less likely to be formed on the side surface EP2 (in particular, on the lower portion of the side surface EP2) of the semiconductor layer EP. In this manner, it is possible to suppress or prevent the metal silicide layer MS from being formed on the side surface EP2 of the semiconductor layer EP and grown into the semiconductor layer SM1. Therefore, it is possible to suppress or prevent the effective thickness of the semiconductor region in the semiconductor layer SM1 from being reduced. Thus, the performance of the semiconductor device can be improved.

Moreover, the problem described with reference to FIG. 45 and FIG. 46 above (second examination example) occur more frequently when the side surface EP2 of the semiconductor layer EP is slanted (in this case, the side surface EP2 of the semiconductor layer EP and the upper surface of the semiconductor layer SM1 form an acute angle). Therefore, in the case where the side surface EP2 of the semiconductor layer EP is slanted, by applying the structure in which one portion of the sidewall spacer SW2 is positioned on (is raised over) the semiconductor layer EP like in the case of the present embodiment the great effect can be achieved. Moreover, the problem described with reference to FIGS. 40 and 41 above (first examination example) occurs in both of the cases where the side surface EP1 of the semiconductor layer EP is almost perpendicular to the main surface of the SOI substrate SUB and where the side surface EP1 of the semiconductor layer EP is slanted. Therefore, the structure in which the sidewall spacer SW3 is formed on the sidewall EP1 of the semiconductor layer EP like in the present embodiment can achieve the advantageous effect when it is applied to any of the cases where the side surface EP1 of the semiconductor layer EP is almost perpendicular to the main surface of the SOI substrate SUB and where the side surface EP1 of the semiconductor layer EP is slanted.

Moreover, in the present embodiment, the ion implantation for forming the $n^+$-type semiconductor region SD (corresponding to step S9) is carried out in a state where one portion of the sidewall spacer SW2 is positioned on (raised over) the semiconductor layer EP. Therefore, even when the side surface EP2 of the semiconductor layer EP is slanted, the portion of the semiconductor layer EP with the reduced thickness due to the slanted side surface EP2 can be covered with the sidewall spacer SW2, and it is possible to prevent the ions for forming the $n^+$-type semiconductor region SD from being easily implanted thereto. The ion implantation for source/drain (corresponding to the ion implantation for forming the $n^+$-type semiconductor region SD) requires a high amount of dose, and when a region with a reduced thickness is present in the semiconductor layer to which ions are to be implanted, the region might be strongly amorphized due to implantation damages. In contrast, in the present embodiment, since one portion of the sidewall spacer SW2 is positioned on (raised over) the semiconductor layer EP, the portion of the semiconductor layer EP with a reduced thickness can be covered with the sidewall spacer SW2, so that it is possible to suppress or prevent the portion from being amorphized by receiving implantation damages by the ion implantation for forming the $n^+$-type semiconductor region SD (corresponding to step S9).

Moreover, in the present embodiment, one portion of the sidewall spacer SW2 is positioned on (raised over) the semiconductor layer EP. Therefore, in the case where the side surface EP2 of the semiconductor layer EP is almost perpendicular to the main surface of the SOI substrate SUB, one portion of the sidewall spacer SW2 gets over the side surface EP2 and is positioned on (raised over) the upper surface of the semiconductor layer EP. More specifically, the outer end portion of the sidewall spacer SW2 in the gate length direction is positioned on the upper surface of the semiconductor layer EP. On the other hand, in the case where the side surface EP2 of the semiconductor layer EP is slanted, the outer end portion of the sidewall spacer SW2 in the gate length direction is positioned on the side surface EP2 of the semiconductor layer EP or it gets over the side surface EP2 and is positioned on the upper surface of the semiconductor layer EP (in this case, the entire side surface EP2 is covered with the sidewall spacer SW2). Of these cases, the latter case is more preferable, and the above-mentioned effects can be more enhanced.

Furthermore, in the present embodiment, the sidewall spacer SW2 is formed on the sidewall of the gate electrode GE in step S8 and the sidewall spacer SW3 is also formed on the sidewall (EP1) of the semiconductor layer EP. Since the sidewall spacer SW2 and the sidewall spacer SW3 are formed in the same process by using the same insulating film (IL4), it is possible to reduce the number of manufacturing processes of the semiconductor device.

Furthermore, in the present embodiment, after the sidewall spacer SW1 is formed on the sidewall of the gate electrode GE in step S4, the semiconductor layer EP is formed in step S5. Then, after at least one portion of the sidewall spacer SW1 (the insulating film IL3 constituting the sidewall spacer SW1 in this case) is removed in step S6, the sidewall spacer SW2 is formed on the sidewall of the gate electrode GE in step S8.

In the case where the semiconductor layer EP is formed in the state where no sidewall spacer SW1 is formed unlike the present embodiment, the semiconductor layer EP comes close to the gate electrode GE, and there is fear that a leakage current occurs between the semiconductor layer EP and the gate electrode GE or the semiconductor layer EP and the gate electrode GE are in contact with each other to cause a short-circuit.

In contrast, in the present embodiment, since the semiconductor layer EP is formed in step S5 after the sidewall spacer SW1 is formed on the sidewall of the gate electrode GE in step S4, the formation position of the semiconductor layer EP can be spaced apart from the gate electrode GE by a distance corresponding to the thickness (thickness in the gate length direction) of the sidewall spacer SW1 in the gate length direction. Therefore, it is possible to appropriately prevent a leakage current from occurring between the semiconductor layer EP and the gate electrode GE and prevent the semiconductor layer EP and the gate electrode GE from being in contact with each other to cause a short-circuit. Accordingly, the performance of the semiconductor device can be improved. Moreover, the reliability of the semiconductor device can be improved.

In the case where the semiconductor layer EP is formed and the sidewall spacer SW2 is then formed without removing the sidewall spacer SW1 at all unlike the present embodiment, the formation position of the $n^+$-type semiconductor region SD and the formation position of the metal silicide layer MS are spaced apart from the gate electrode GE (in the gate length direction) by a distance corresponding to the total of the thickness of the sidewall spacer SW1 and the thickness of the sidewall spacer SW2. In this case, there is fear that the formation positions of the n$^+$-type semiconductor region SD and the metal silicide layer MS are too far from the channel formation region.

In contrast, in the present embodiment, after the semiconductor layer EP is formed and at least one portion of the sidewall spacer SW1 (the insulating film IL3 constituting the sidewall spacer SW1 in this case) is removed, the sidewall spacer SW2 is formed. Therefore, it is possible to prevent the formation position of the n$^+$-type semiconductor region SD and the formation position of the metal silicide layer MS from being too far from the channel formation region, and the formation position can be optimized. In other words, in the present embodiment, the formation position of the semiconductor layer EP can be controlled to an optimal position by adjusting the thickness of the sidewall spacer SW1 (thickness in the gate length direction), and the formation positions of the n$^+$-type semiconductor region SD and the metal silicide layer MS can be controlled to optimal positions by adjusting the thickness of the sidewall spacer SW2 (thickness in the gate length direction) without being affected by the thickness of this sidewall spacer SW1. Thus, the formation position of the semiconductor layer EP and the formation positions of the n$^+$-type semiconductor region SD and the metal silicide layer MS can be respectively optimized.

Moreover, in the present embodiment, the ion implantation process for forming the n$^-$-type semiconductor region EX in step S7 is carried out after at least one portion of the sidewall spacer SW1 (the insulating film IL3 constituting the sidewall spacer SW1 in this case) is removed in step S6 and before the sidewall spacer SW2 is formed in step S3. In another aspect, the ion implantation process for forming the n$^-$-type semiconductor region EX corresponding to step S7 can be carried out after the gate electrode GE is formed in step S1 and before the sidewall spacer SW1 is formed in step S4. In this case, the gate electrode GE functions as a mask (ion implantation blocking mask), and the n-type impurity is ion-implanted into the regions in the semiconductor layer SM1 on the both sides of the gate electrode GE, thereby forming the n$^-$-type semiconductor regions EX.

In fact, in comparison with the case in which the ion implantation process for forming the n$^-$-type semiconductor region EX is carried out before forming the sidewall spacer SW1 in step S4, the case of the present embodiment in which step S7 (the ion implantation process for forming the n$^-$-type semiconductor region EX) is carried out between step 6 and step 8 has the following advantages. That is, when the underlying semiconductor region has a high impurity concentration, the epitaxial layer is less likely to grow and its growth rate tends to become slower. In the present embodiment, instead of carrying out the ion implantation process for forming the n$^-$-type semiconductor region EX before forming the sidewall spacer SW1 in step S4, the ion implantation process for forming the n$^-$-type semiconductor region EX is carried out in step S7 after forming the semiconductor layer EP in step S5. Therefore, the semiconductor layer EP can be epitaxially grown in step S5 on the semiconductor layer SM1 to which the ion implantation process for forming the n$^-$-type semiconductor region EX is not carried out. For this reason, since the impurity concentration of the semiconductor layer SM1 serving as a base layer under the semiconductor layer EP can be lowered at the time when the semiconductor layer EP is epitaxially grown in step S5, the semiconductor layer EP can be grown more easily, and the growth rate of the semiconductor layer EP can be increased. Thus, the semiconductor layer EP can be more appropriately formed and the performance of the semiconductor device can be more improved. Moreover, it is possible to shorten the period of time required for forming the semiconductor layer EP, and the throughput of the semiconductor device can be improved.

In the case where the semiconductor layer EP is formed and the sidewall spacer SW2 is then formed without removing the sidewall spacer SW1 at all unlike the present embodiment, the ion implantation process for forming the n$^-$-type semiconductor region EX is carried out in a state where the sidewall spacer SW1 is formed on the sidewall of the gate electrode GE. In this case, since the sidewall spacer SW1 functions as a mask (ion implantation blocking mask), it becomes difficult to form the n'-type semiconductor region EX at a position adjacent to the channel formation region.

In contrast, in the present embodiment, after the semiconductor layer EP is formed and at least one portion of the sidewall spacer SW1 (the insulating film IL3 constituting the sidewall spacer SW1 in this case) is then removed, the sidewall spacer SW2 is formed. For this reason, the ion implantation process for forming the n$^-$-type semiconductor region EX in step S7 can be carried out in a state where at least one portion of the sidewall spacer SW1 (the insulating film IL3 constituting the sidewall spacer SW1 in this case) is removed. Thus, it is possible to appropriately form the n$^-$-type semiconductor region EX at a position adjacent to the channel formation region. Moreover, it is possible to control the overlapping amount between the n$^-$-type semiconductor region EX and the gate electrode GE by adjusting a thickness of a remaining portion (the thickness of the insulating film IL2 left on the sidewall of the gate electrode GE after step S6 in this case) at the time when at least one portion of the sidewall spacer SW1 (the insulating film IL3 constituting the sidewall spacer SW1 in this case) is removed in step S6.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. A semiconductor device provided with a MISFET, comprising:
   a substrate having a support substrate, an insulating layer on the support substrate and a first semiconductor layer on the insulating layer;
   a gate electrode of the MISFET, formed on the first semiconductor layer via a gate insulating film;
   a first sidewall insulating film formed on a sidewall of the gate electrode;
   an epitaxial semiconductor layer for source/drain of the MISFET, formed on the first semiconductor layer;
   a second sidewall insulating film formed on a sidewall of the epitaxial semiconductor layer; and
   an element isolation region which is formed in the substrate and penetrates through the first semiconductor layer and the insulating layer and whose bottom portion reaches the support substrate,
   wherein a compound layer between metal and an element constituting the epitaxial semiconductor layer is formed on an upper portion of the epitaxial semiconductor layer, and
   wherein the second sidewall insulating film is formed on the sidewall of the epitaxial semiconductor layer, is positioned on the element isolation region, and covers a side surface of the first semiconductor layer.

2. The semiconductor device according to claim 1, wherein one portion of the first sidewall insulating film is positioned on the epitaxial semiconductor layer.

\* \* \* \* \*